(12) United States Patent
Rios et al.

(10) Patent No.: US 6,960,517 B2
(45) Date of Patent: Nov. 1, 2005

(54) N-GATE TRANSISTOR

(75) Inventors: Rafael Rios, Portland, OR (US); Brian S. Doyle, Portland, OR (US); Thomas D. Linton, Jr., San Jose, CA (US); Jack Kavalieros, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/610,835

(22) Filed: Jun. 30, 2003

(65) Prior Publication Data

US 2004/0262699 A1 Dec. 30, 2004

(51) Int. Cl.⁷ .......................................... H01L 21/3205
(52) U.S. Cl. ...................... 438/595; 438/585; 257/344; 257/408
(58) Field of Search ............................. 438/585, 595, 438/666, 669; 257/344, 408

(56) References Cited

U.S. PATENT DOCUMENTS

| | | | | |
|---|---|---|---|---|
| 4,818,715 A | * | 4/1989 | Chao ........................... 438/303 |
| 4,907,048 A | * | 3/1990 | Huang ......................... 257/344 |
| 4,994,873 A | * | 2/1991 | Madan ......................... 257/315 |
| 5,880,015 A | * | 3/1999 | Hata ........................... 438/585 |
| 6,437,550 B2 | * | 8/2002 | Andoh et al. ................. 323/315 |

OTHER PUBLICATIONS

Chau, Robert, et al., Advanced Depleted–Substrate Transistors: Single–gate, Double–gate and Tri–gate (Invited Paper), Components Research, Logic Technology.

Development, Intel Corporation, 5200 N.E. Elam Young Parkway, HIllsboro, OR 97124, Mail stop RA1–232, USA, 2 pages, no date.

* cited by examiner

*Primary Examiner*—Ori Nadav
(74) *Attorney, Agent, or Firm*—Blakley, Sokoloff, Taylor & Zafman LLP

(57) ABSTRACT

A n-gate transistor, and method of forming such, including source/drain regions connected by a channel region and a gate electrode coupled to the channel region. The channel region has many angled edges protruding into the gate electrode. The many angled edges are to act as electrically conducting channel conduits between source/drain regions.

6 Claims, 30 Drawing Sheets

N-GATE TRANSISTOR

FIELD

The present invention relates generally to the field of semiconductor technology and, more specifically, to formation of a transistor.

BACKGROUND

In the semiconductor fabrication industry, it is a common goal to make an integrated circuit progressively smaller, faster, and more efficient. However as the basic circuit devices, such as transistors, get smaller, the reduced device dimensions cause otherwise tolerable electrical effects to become unacceptably large. One such undesirable effect is the difficulty of the gate of the transistor to precisely control current flow through the body terminal (i.e, the channel region) of the transistor. More specifically, as shown in FIG. 1A, as a transistor's dimensions grow smaller source/drain regions 10 become very close. The channel distance (d) is very small and consequently excessive current tends to leak from source/drain regions 10 outside the control of the gate electrode 12. Additionally, the ever increasing encroachment of the source/drain regions 10 underneath the gate electrode 12 tends to cause additional capacitance leading to other undesirable short channel effects.

Some devices have been formed in an attempt to correct undesirable short channel effects. One such device is the tri-gate device. A tri-gate device, as shown at FIG. 1B, includes source/drain regions 20, on an insulator layer 22 overlying a substrate 24. A gate electrode 26 is formed to surround a portion of the source/drain regions 20 defining an internal channel region 50 within the device connecting. A cross-section of this channel region 50 is shown at FIG. 1C, along the gate width of the device. As shown in FIG. 1C, the channel region 50 has three planar walls (61, 62, and 63) that are connected to the gate electrode 26 via a gate dielectric 65. Two of the walls 61 and 62 are vertical while one wall 63 is horizontal. Each of the three planar walls 61, 62 and 63 is termed a "gate", $G_1$, $G_2$, and $G_{30}$ respectively, since the gate electrode 26 makes electrical connection to each, and, thus, can provide a voltage to each side. It was believed that the three gates allowed a full depletion of the device. The tri-gate device is advantageous for several reasons. For example, because of its three-gate design, the gate electrode 26 can control the channel region with more precision. Additionally, because of its nature as a semiconductor-on-insulator device, capacitances are lower at source/drain regions 20, thus improving the device switching speed.

However, despite these advantages, technology continues to progress and transistor designs continue to shrink. Consequently, even the tri-gate design begins to face challenges in controlling current in the channel region, and other short channel effects.

BRIEF DESCRIPTION OF THE DRAWINGS

Embodiments of the present invention are illustrated by way of example and should not be limited by the figures of the accompanying drawings in which like references indicate similar elements and in which:

FIG. 4A–4J illustrate a method of forming the transistor 300 according to one embodiment of the invention;

DETAILED DESCRIPTION

Described herein is an "n" gate transistor. In the following description numerous specific details are set forth. One of ordinary skill in the art, however, will appreciate that these specific details are not necessary to practice embodiments of the invention. While certain exemplary embodiments of the invention are described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art. In other instances well known semiconductor fabrication processes, techniques, materials, equipment, etc., have not been set forth in particular detail in order to not unnecessarily obscure embodiments of the present invention.

Embodiments of the invention described herein include a transistor device including a body terminal (i.e., "channel region") with many (more than two) corners, or protruding angled edges. The protruding angled edges extend through the entire length of the channel region, connecting source/drain regions. The protruding angled edges allow a build up of inversion charge within an angled corner and thus act as electrically conducting conduits inside the channel region. Consequently, according to embodiments of the invention described herein, the many angled edges may be referred to herein as electrically conducting channel conduits, or "channel conduits" for short, because each angled edge is to act like a conduit for inversion charge, to enhance the flow of electricity through the channel region.

Figure 1A:
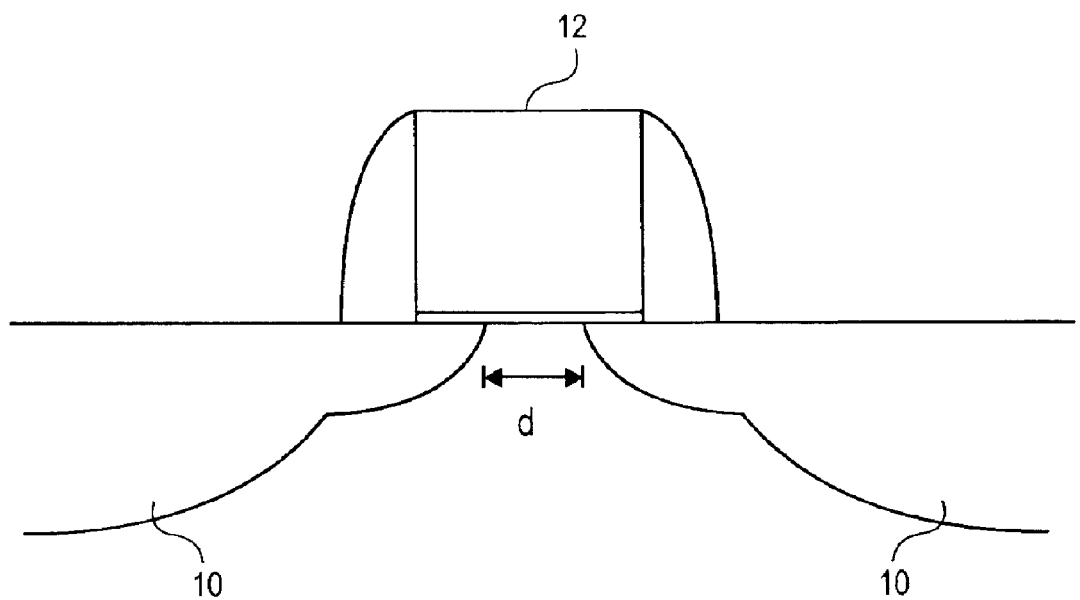
FIG. 1A–1C illustrate transistors according to the prior art.
Figure 1B:
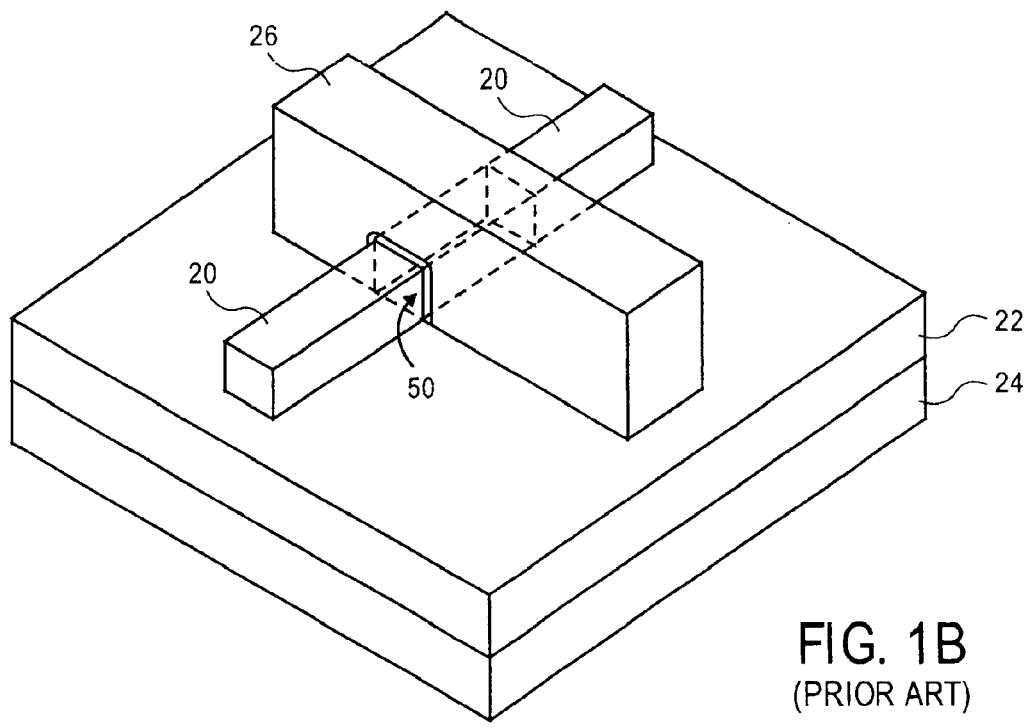
Figure 1C:
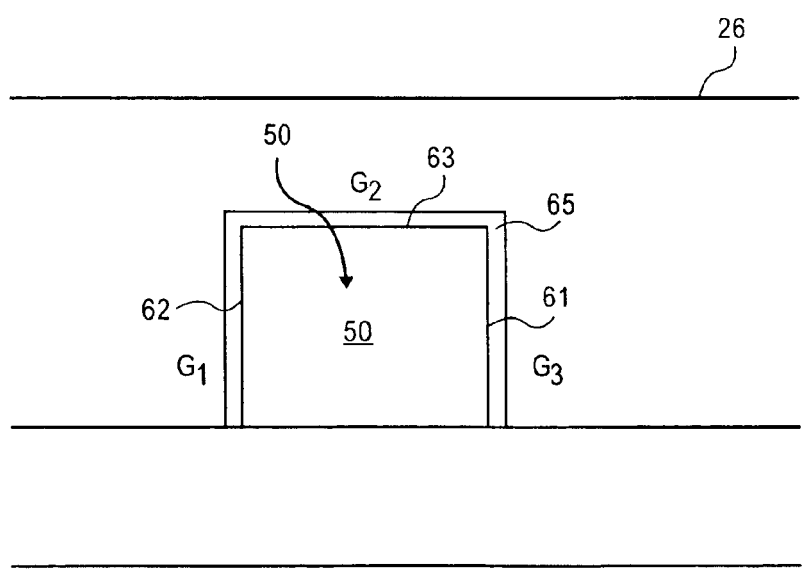
Figure 2:
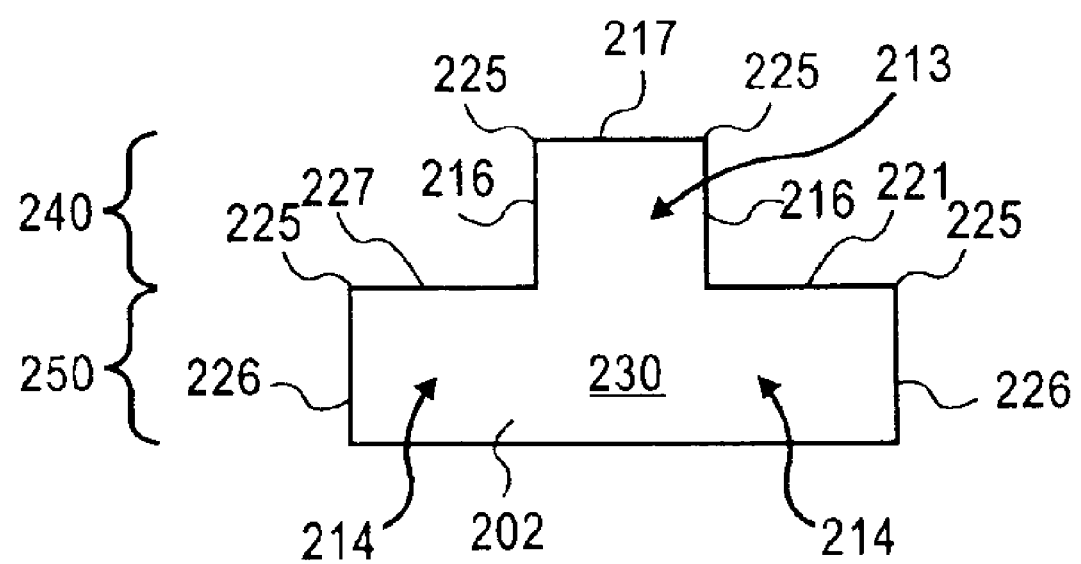
FIG. 2 is a cross-sectional illustration of a body terminal of a transistor device according to one embodiment of the invention.

FIG. 2 is a cross-sectional illustration of a body terminal ("channel region") of a transistor device according to one embodiment of the invention. Referring to FIG. 2, the channel region has many protruding corners 225, or angled edges. Additionally, the channel region is formed from a semiconductor material 202 to have a stair-step shaped structure 230. The stair-step structure 230 is a stair-step shaped polyhedron that includes at least two stair-step levels, "upper" stair-step level 240 and "lower" stair-step level 250. The upper stair-step level 240 includes at least one stair step 213. As shown in FIG. 2, the stair step 213 may have two vertical sidewalls 216 and one horizontal topwall 217. The lower stair-step level 250 also includes at least one stair step 214 subjacent to the upper stair step 213. As shown in FIG. 2, the lower stair-step level may include two lower stair steps 214 straddling the upper stair step 213. Thus, the stair-step structure 230 may include seven planar walls (216, 217, 226, and 227). The seven planar walls (216, 217, 226, and 227) may connect at approximately right angles to the form four corners 225, which are cross-sectional representations of angled edges, or channel conduits, that extend through a portion of the semiconductor material 202 in a direction that extends outside of the cross-sectional plane shown in FIG. 2. The seven planar walls (216, 217, 226, and 227) are each long enough to maximize a build-up of inversion charge inside the abruptly angled inner contour of the corners 225 and short enough to minimize the amount of semiconductor material 202 needed to create the stair-step structure 230, hence minimizing the overall size of the stair-step structure.

Figure 3A:
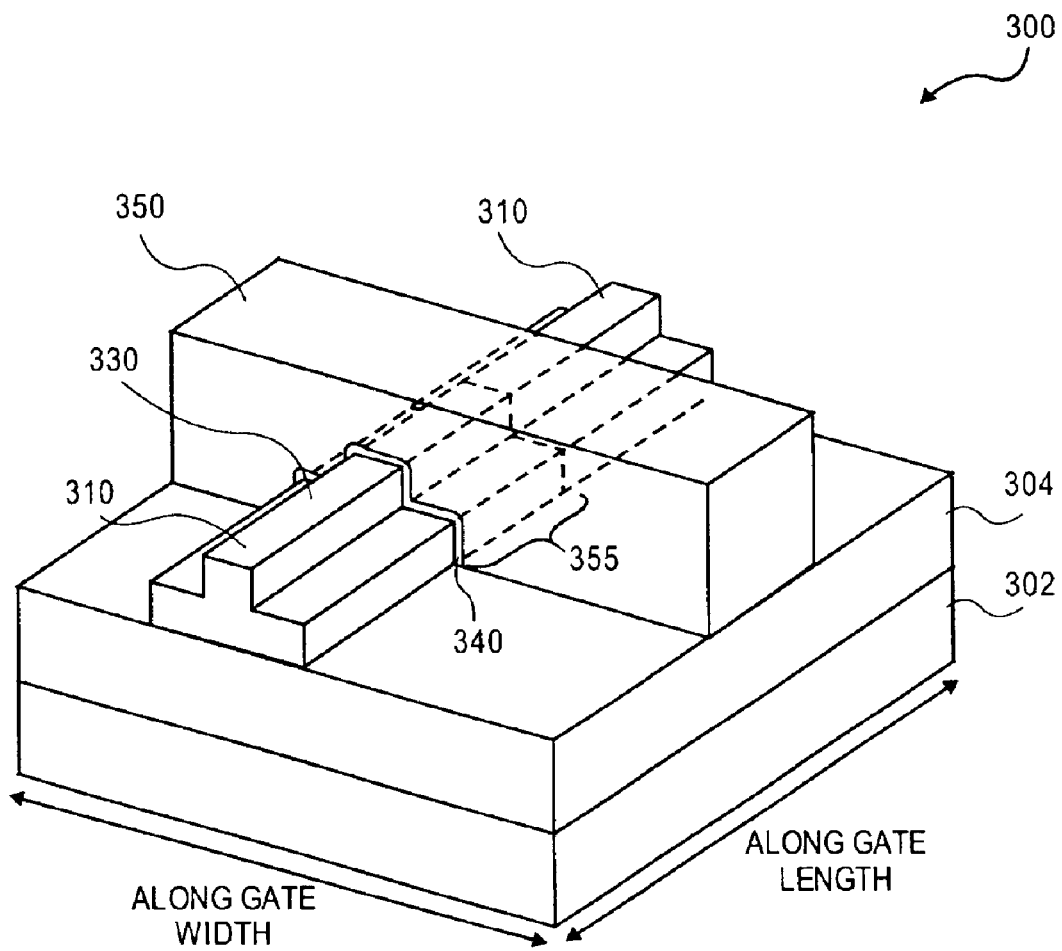
FIG. 3A is a three-dimensional dissected view of a semiconductor-on-insulator (SOI) transistor 300 according to one embodiment of the invention.

FIG. 3A is a three-dimensional dissected view of a semiconductor-on-insulator (SOI) transistor 300 according to one embodiment of the invention. Referring to FIG. 3A, the transistor 300 includes source/drain regions 310, a gate electrode 350, a gate dielectric 340, and a channel region 355 enclosed within the gate dielectric 340 and surrounded by the gate electrode 350. The source/drain regions 310, and the channel region 355 connecting the source/drain regions 310, are formed of the same basic semiconductor material, such as silicon or germanium, and hence the source/drain regions 310 and the channel region 355 may be collectively referred to, herein, as a semiconductor "body" 330. According to FIG. 3A, the semiconductor body 330 is formed upon an insulator layer 304 and may more aptly be referred to as a "floating" semiconductor body, or perhaps even a semiconductor "island" because it is entirely isolated from an underlying substrate 302 by the insulator layer 304. The substrate 302 may be a semiconductor material, such as monocrystalline silicon.

Figure 3B:
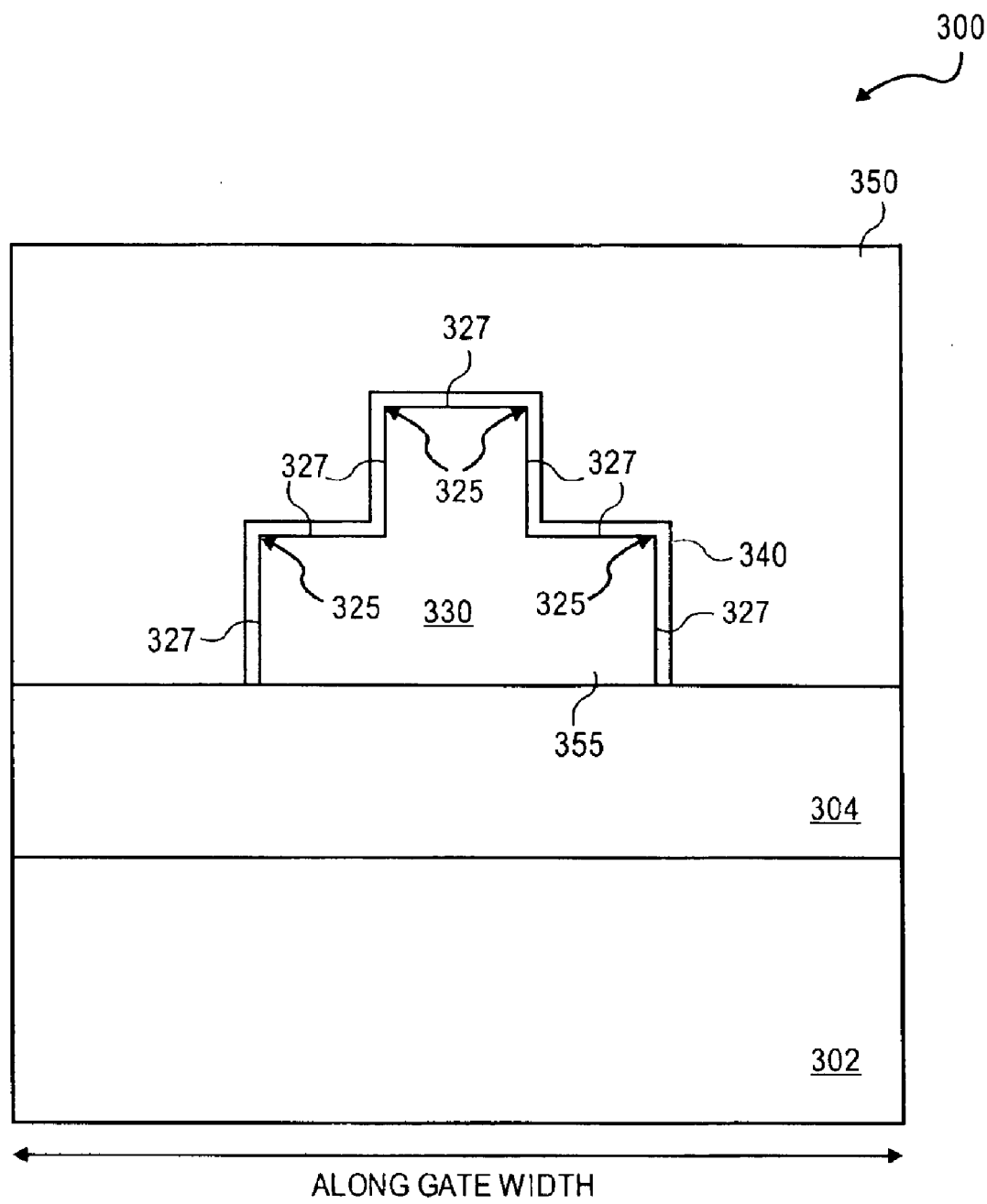
FIG. 3B is a cross sectional view of the transistor 300 along the gate width.

FIG. 3B is a cross sectional view of the transistor 300 along the gate width according to one embodiment of the invention. Referring to FIG. 3B, according to one embodiment of the invention, the semiconductor body 330 is formed to have many (more than two) protruding angled edges 325 and many planar walls 327. According to the embodiment of the invention shown in FIG. 3B, the semiconductor body 330 has at least four protruding angled edges 325 that jut, poke, project, or in some way abruptly protrude into the gate electrode 350. Additionally, according to the embodiment of the invention shown in FIG. 3B, the semiconductor body 330 has seven or more planar walls 327 that border the gate electrode 350 within the channel region 355. The planar walls 327 that are surrounded by the gate electrode 350 may be referred to, generally, as "channels" since they are effectively controlled by the gate electrode 350, separated only by the gate dielectric 340. Consequently, the embodiment of the invention shown in FIG. 3A–3B may be more aptly referred to as a seven-gate device, or a "sept-gate" device, since the gate electrode 350 and the planar walls 327 of the channel region 355 combine to form seven electrical gate connections.

Figure 3C:
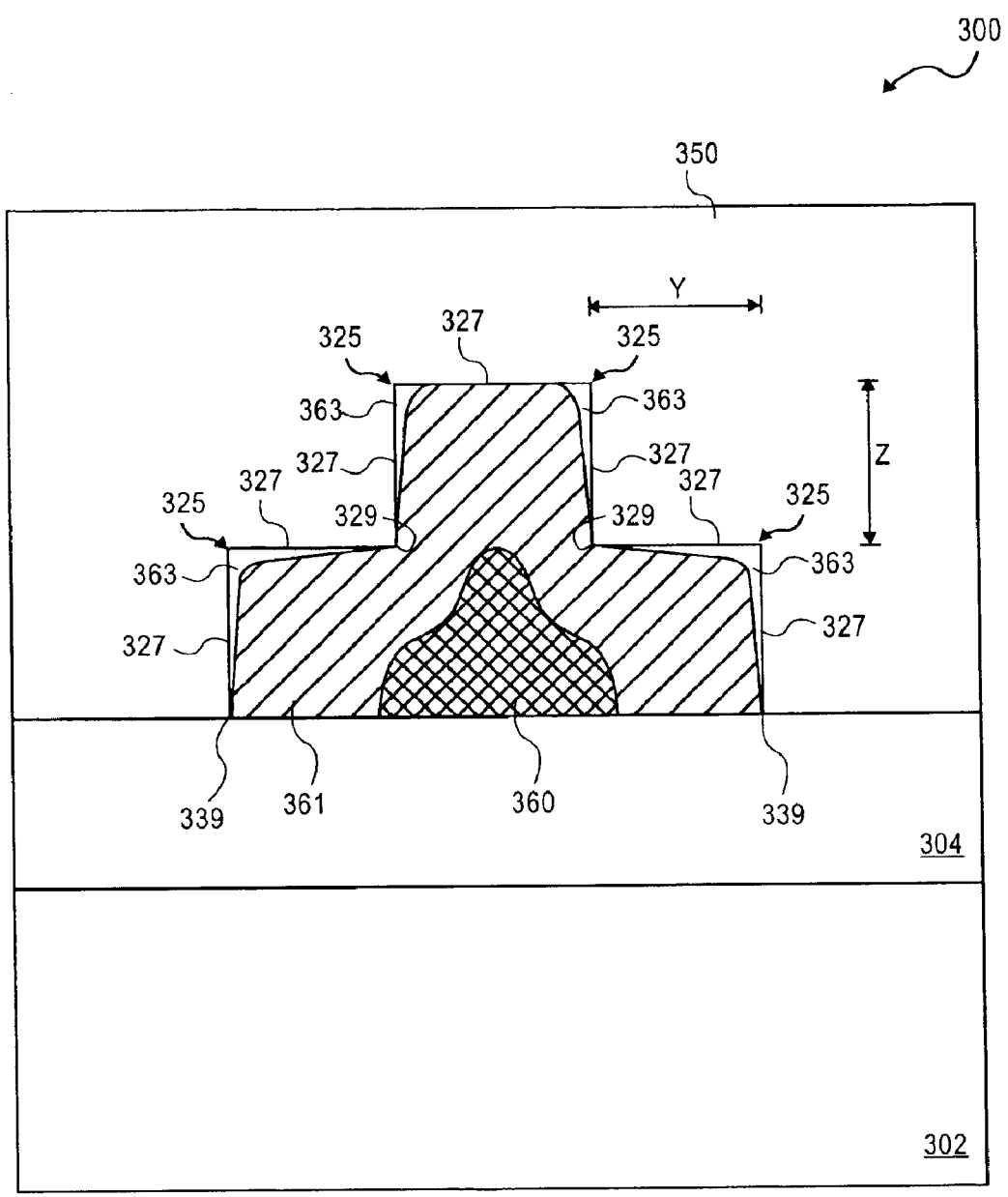
FIG. 3C is a charge density illustration of a cross sectional view of the transistor 300 along the gate width.

FIG. 3C is a charge density illustration of a cross sectional view of the transistor 300 along the gate width according to one embodiment of the invention. The charge density graph shows different areas of charge density when a voltage has been applied to the gate electrode 350. A center area 360 shows a portion of relatively little electrical activity, or a "non-depleted" area. Closer to the walls 327 is another area 361 of relatively moderate electrical activity. However, within the protruding angled edges 325 are areas 363 of high electrical activity. Areas 363 comprise inversion charge confined primarily to the abruptly angled curvature of the protruding angled edges 325, and taper off toward the inverted corners 329 and the bottom corners 339. These protruding angled edges 325, may be referred to as "channel conduits 325", wherein electrical charge builds up and flows between source/drain regions of the device. With four channel conduits 325, the gate electrode 350 has a very strong control over the electrical charge through source/drain regions 310 that are illustrated in FIG. 3A. Since the strongest charge density is constrained to the protruding angled edges that are under strong gate field control, there is little effect from the drain field on this charge, resulting in reduced short-channel effects.

Still referring to FIG. 3C, each wall 327 of the transistor should be formed to have a length that maximizes the effect of the inversion charge within the channel conduits 325. At the same time, the wall lengths should be short enough to minimize the amount of semiconducting material used to form the device. As shown in FIG. 3C, the length (Y) of the horizontal walls and the length (Z) of the vertical walls are designed so that the inversion charge reduces to an insignificant amount at the inverted corners 329 and bottom corners 339. The lengths (Y and Z) may vary according to the design requirements of the device and the operational voltage applied to the gate electrode. In one embodiment of the invention, however, the lengths of the horizontal walls may be approximately equal to the depletion depth. However, these dimensions may be independently optimized for best overall performance of the device.

Figure 3D:
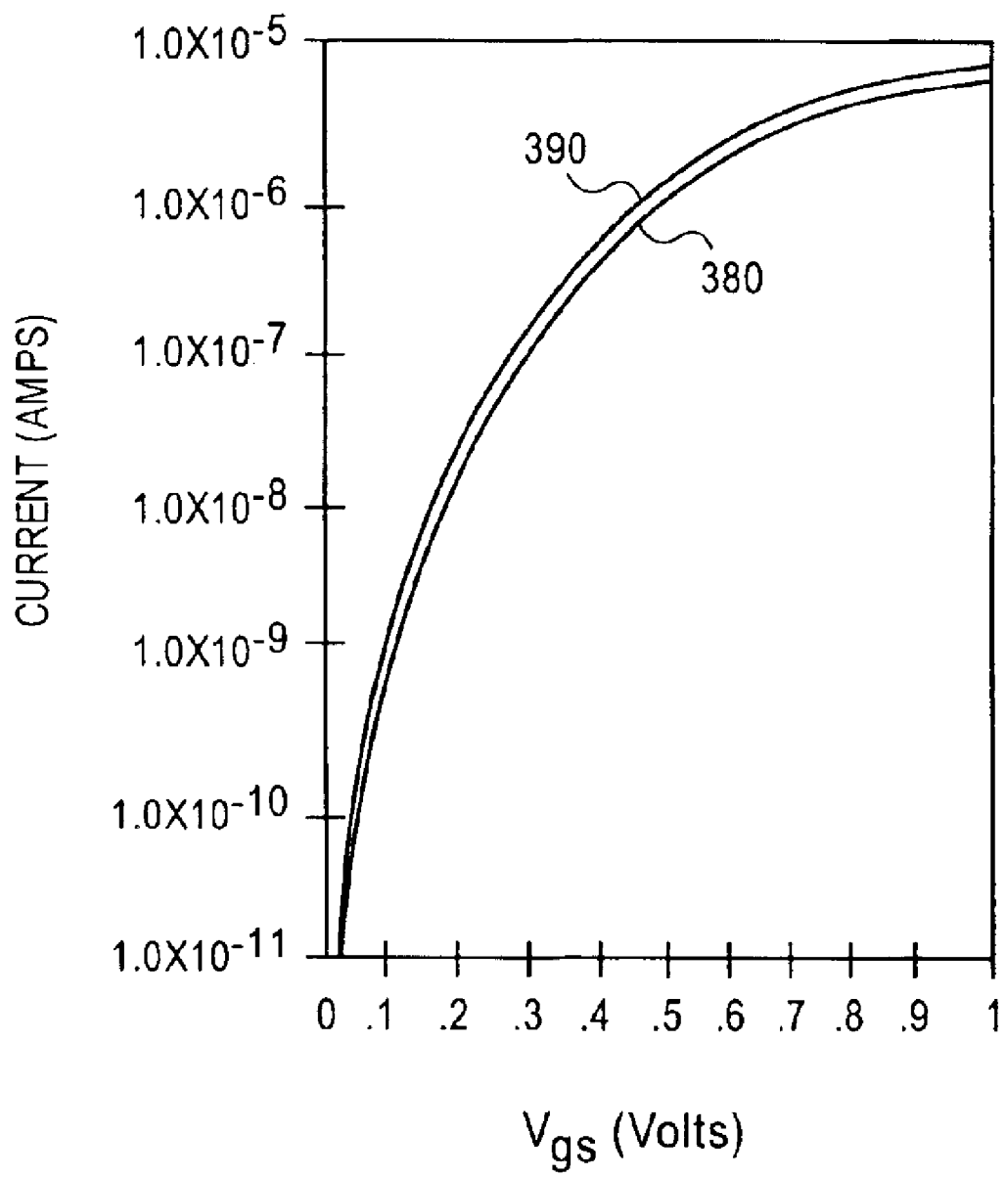
FIG. 3D is a current-to-voltage graph for the transistor 300.

FIG. 3D is a current-to-voltage graph for the transistor 300 according to one embodiment of the invention, according to simulation. As shown in FIG. 3D, the current 390 through the channel region for the seven-gate transistor 300, as described above, is significantly better than the current 380 of a conventional tri-gate device, for the same gate electrode voltage. Through a range of normal operations voltages, the current 390 for the seven gate transistor 300 is expected to out perform the current 380 of the conventional tri-gate device by 20%.

FIG. 4A–4J illustrate a method of forming the transistor 300 according to one embodiment of the invention. The method begins, in FIG. 4A, with forming an insulator layer 304 over a substrate 302 and forming a semiconductor layer 406 over the insulator layer 304. The composite stack of substrate 302, insulator layer 304, and semiconductor layer 406 may be formed by known processes such as thermal bonding techniques, cutting techniques, separation by implantation of oxygen (SIMOX) techniques, or any combination thereof. The insulator layer 304 may include any dielectric material, such as silicon oxide or other high k dielectrics. The substrate 302 may be a conductor or semiconductor such as silicon (Si), silicon germanium (SiGe), silicon germanium carbide (SiGeC), silicon carbide (SiC), polysilicon, epitaxial silicon, amorphous silicon, or any combination thereof. The semiconductor layer 406 may comprise any semiconductor material used to form a transistor device. Examples of semiconductor materials may include the same materials as those already mentioned for the substrate 302 and further including antimony, arsenic, boron, carbon, germanium, selenium, silicon, sulfur, and tellurium. Other semiconductor materials may include gallium arsenide, and indium antimonide. In one embodiment of the invention, the semiconductor layer 406 comprises lightly doped monocrystalline silicon while the substrate 302 comprises heavily doped monocrystalline silicon doped to a different conductivity than the semiconductor layer 406. The thickness (h) of the semiconductor layer 406 depends on the desired height of a subsequently formed channel region as well as the desired height of the vertical sidewalls of the stair-step structure that will form the sept-gate channel region. The layer thickness (h) is technology dependent, and may be optimized to meet some constraint, or may be limited by process capabilities. For example, the insulator 304 thickness is about 150 nm and the semiconductor layer 406 has a thickness of about 40 nm when the gate length is 60 nm. The thicknesses of the insulator 304 and the semiconductor layer 406 can be decreased as the gate length decreases.

Figure 4A:
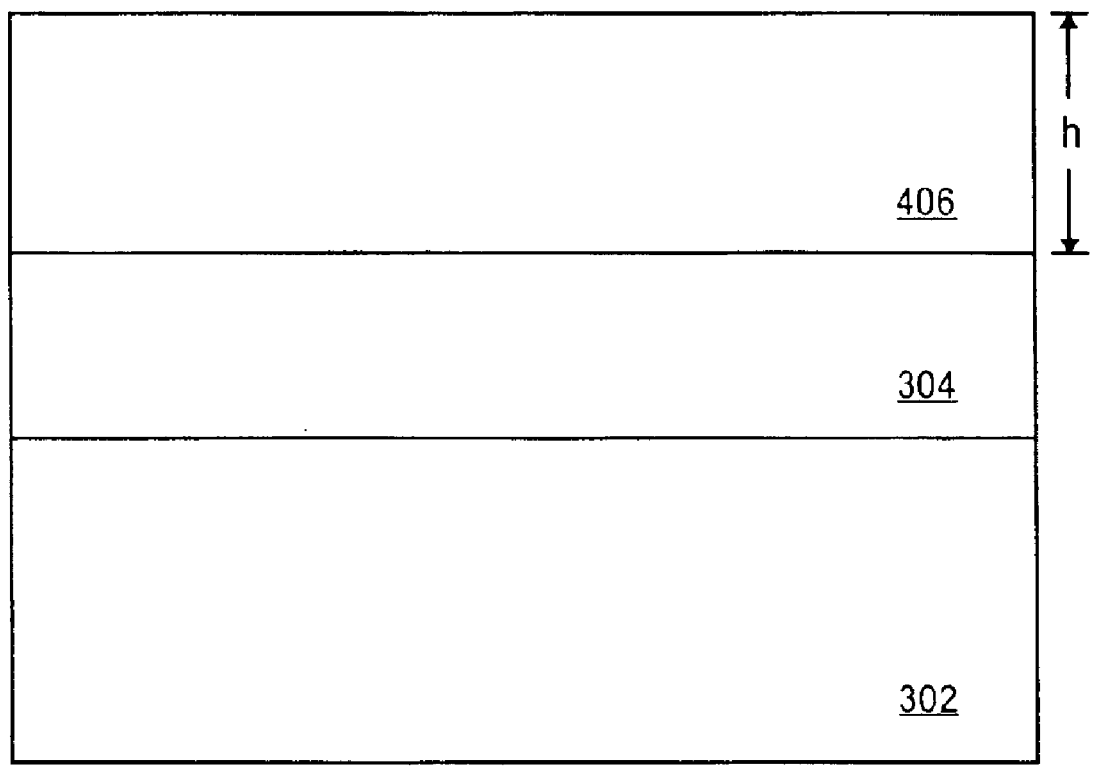
Figure 4B:
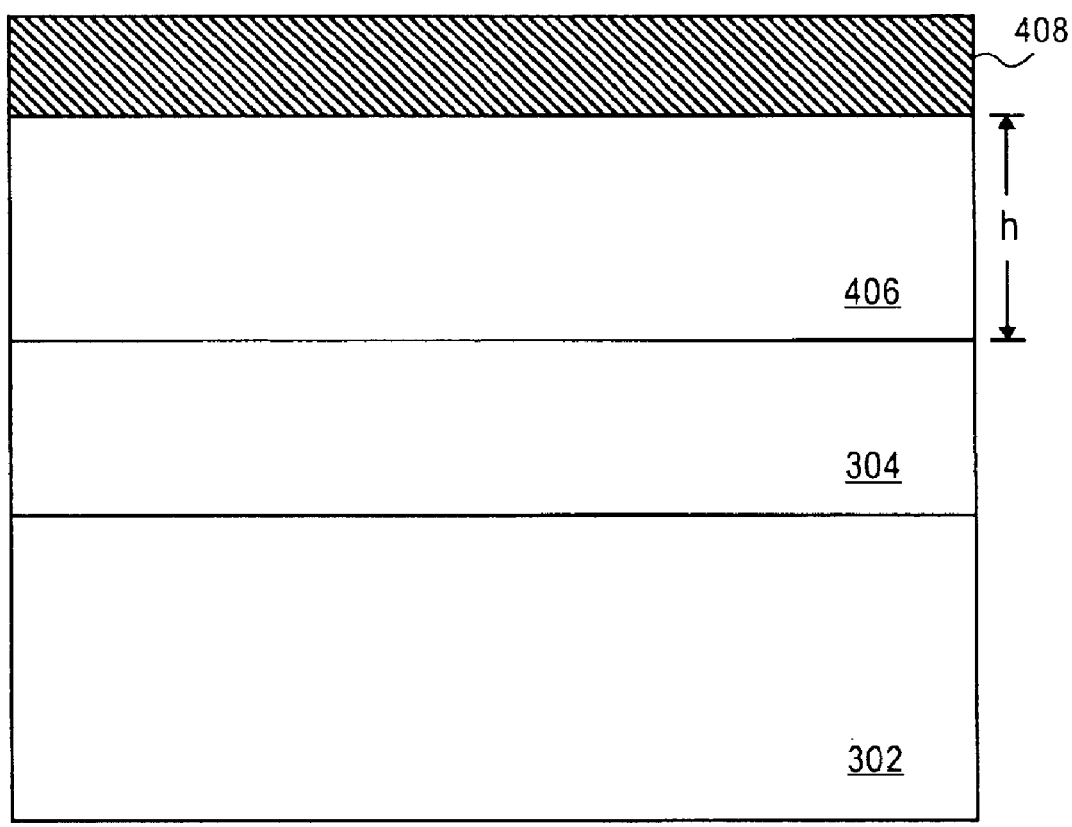

As shown in FIG. 4B, a protective mask layer 408 is formed from a material different in material composition than the semiconductor layer 406 and the insulator layer 304. Specifically, the material of the protective mask layer 408 may be a material composition that can be etched by chemistry that will etch the protective mask layer 408 but that will not etch the underlying semiconductor layer 406 or the insulator layer 304. In the embodiment of the invention shown in FIG. 4B, the protective mask layer 408 is formed from a material typically used as a hardmask, such as an oxide, nitride, oxynitride, or any combination thereof. In one embodiment of the invention, the protective mask layer 408 is a nitride material. Consequently, according to embodiments of the invention, the protective mask layer 408 may also be referred to as a hardmask layer 408. The hardmask layer 408 may be formed by any known method of forming a thin film including chemical vapor deposition (CVD), plasma-assisted CVD, evaporation, sputtering, atomic layer deposition, chemical solution deposition, or thermal growing processes such as oxidation, nitridation or oxynitridation.

Figure 4C:
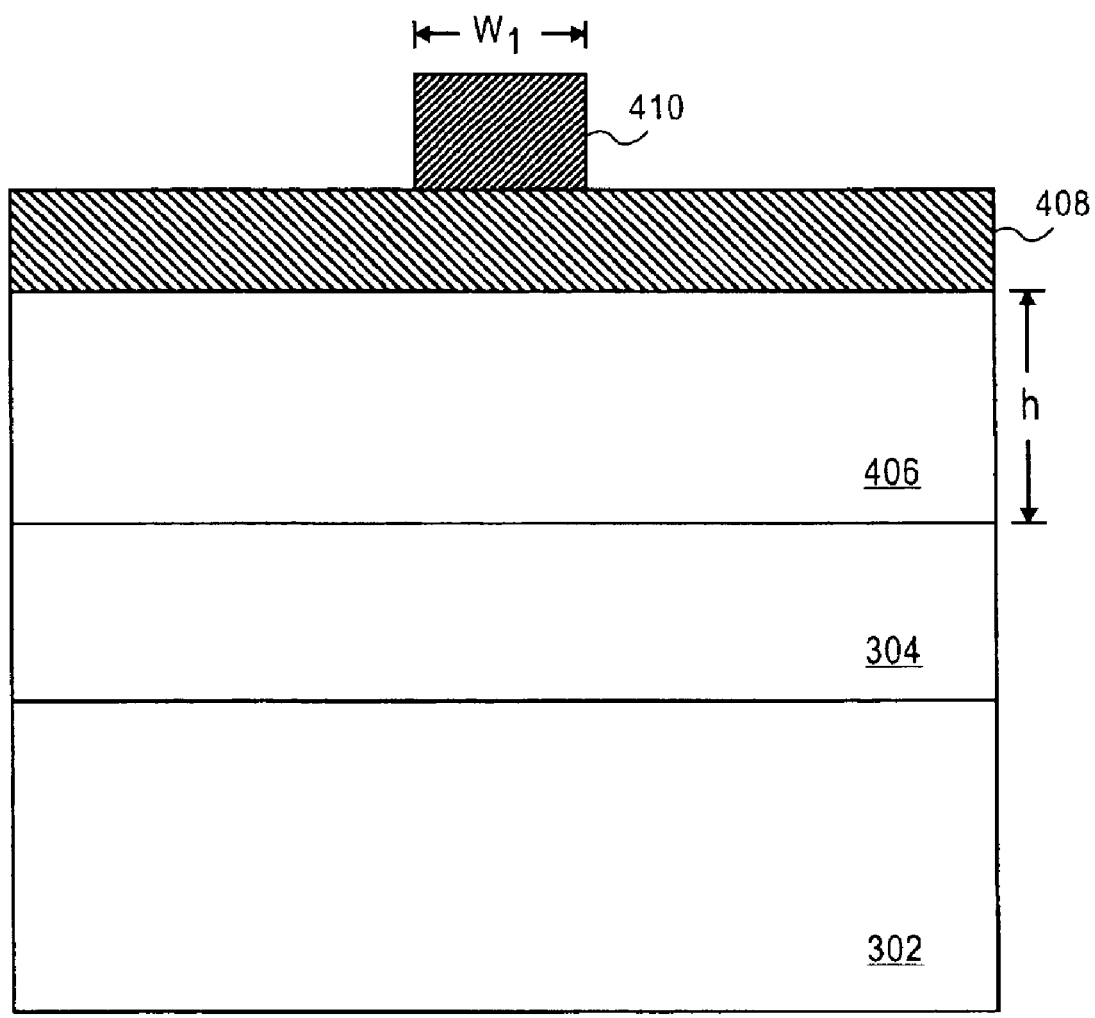

Next, as shown in FIG. 4C, a photoresist mask 410 may be formed on the hardmask layer 408 via known photolithography techniques including depositing a photoresist material, masking the photoresist material, exposing the photoresist material, and developing the exposed photoresist material to form the patterned photoresist mask 410. The photoresist mask 410 should be formed to a desired width (w1) that will represent the width of an upper stair step, as described in conjunction with FIG. 4E below.

Figure 4D:
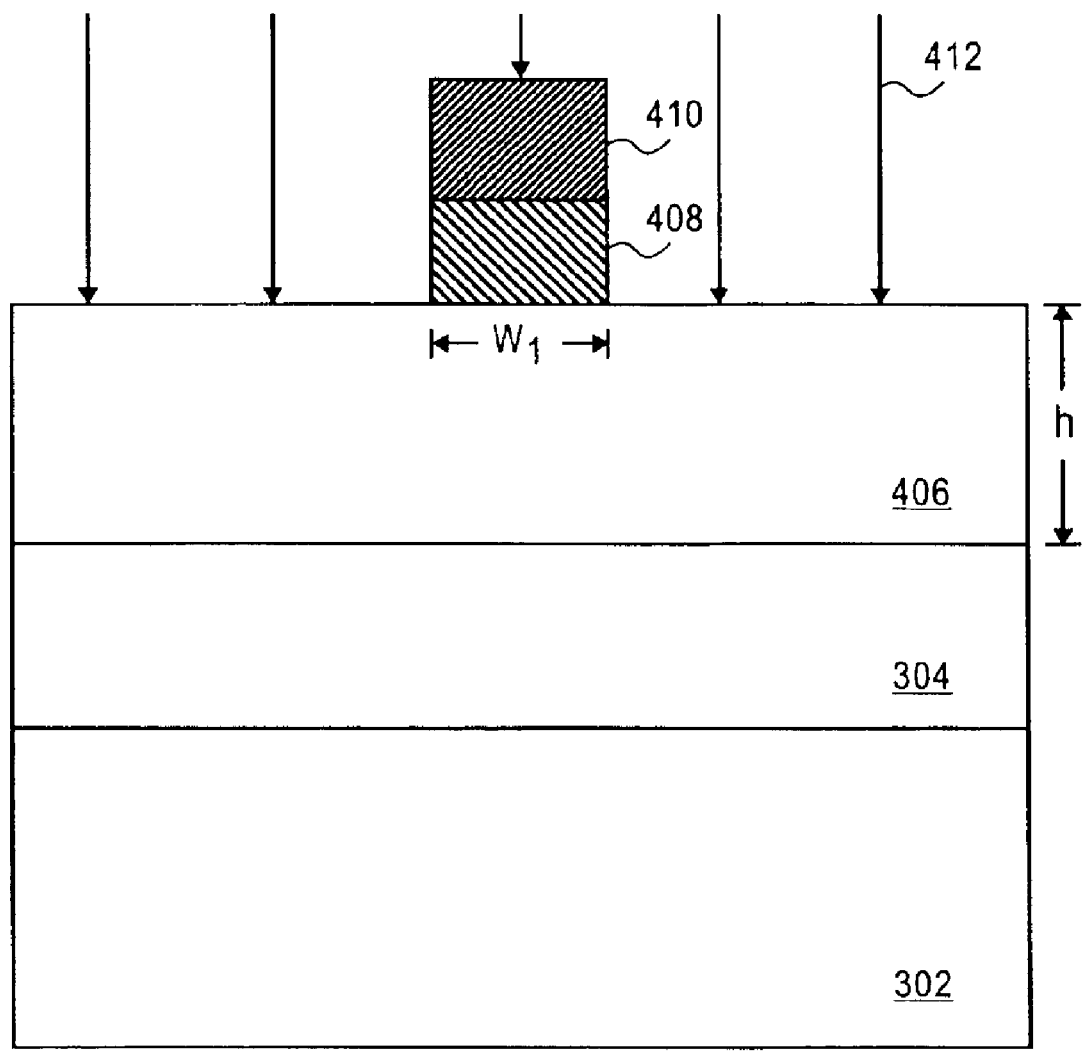

Next, as shown in FIG. 4D, the pattern of the photoresist mask 410 is then transferred to the hardmask layer 408 via an etching technique utilizing an etchant 412 with a particular chemistry that etches the hardmask layer 408 but that does not etch the semiconductor layer 406. The photoresist mask 410 protects the underlying portion of the hardmask layer 408 from the etchant 412, thus forming a "hardmask" 408. Hardmask 408 has the same width (w1) as the photoresist mask 410.

Figure 4E:
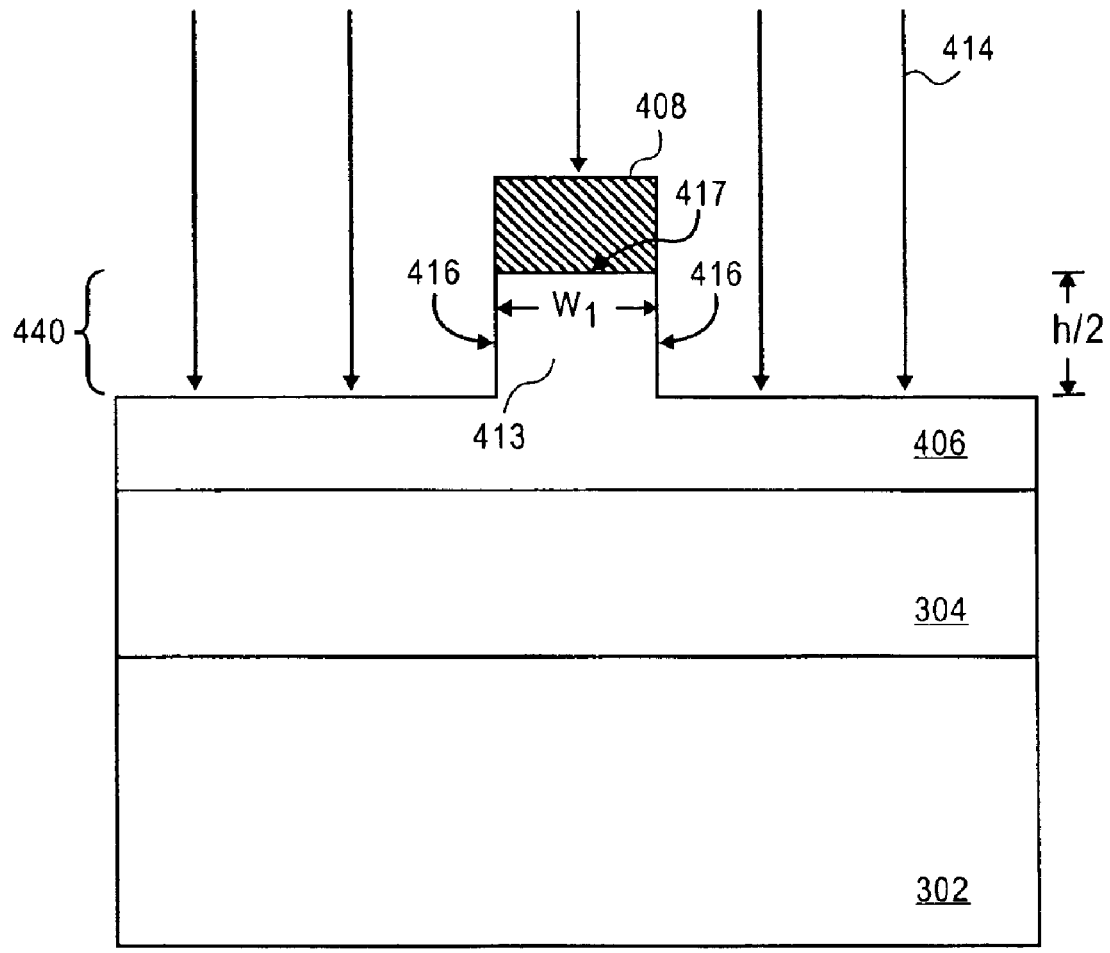

Referring now to FIG. 4E, after photoresist layer 410 is removed, a first portion of the semiconductor layer 406 is etched by etchant 414 to a first thickness, in alignment with the hardmask 408, by a first timed etch, to form a first stair-step level 440. Etching techniques may include reactive ion etching (RIE), plasma etching, ion beam etching, or other known etching techniques. The etchant 414 may includes a chemistry that etches the semiconductor layer 406 but that does not etch the hardmask 408. The semiconductor layer 406 is not etched entirely, but is timed so that only half of the thickness (h/2) of the semiconductor layer 406 is etched. For a semiconductor layer 406 having a thickness h, etchant 414 may have a given etch rate of X nm/min. Thus, the time for the etch would be equal to (h/2)/(Xnm/min) so that the semiconductor layer 406 is not overetched beyond h/2. In one embodiment of the invention, the semiconductive layer 406 comprises silicon; hence, an exemplary etchant 414 may include an etch chemistry layer such as HBr, $SF_6$, $Cl_2$, $CF_4$, and mixtures of these gases with $H_2$, Ar, He, and $O_2$ to etch silicon.

During etching, the hardmask 408 protects the portion of the underlying semiconductor layer 406 directly underneath the hardmask 408 from the etchant 414, thus forming a first, or "upper", stair step level 440. The upper stair-step level 440 has a plateau shaped stair step 413 that includes two vertical sidewalls 416 and one horizontal topwall 417. The length of the vertical sidewalls 416 is equivalent to h/2. The width ($w_1$) of the upper horizontal topwall 417 is the same width as that of the hardmask 408. Hence, as described previously, when the hardmask 408 is formed, the width of the hardmask 408 should be formed to the desired width (w1) of the upper stair step 413.

Figure 4F:
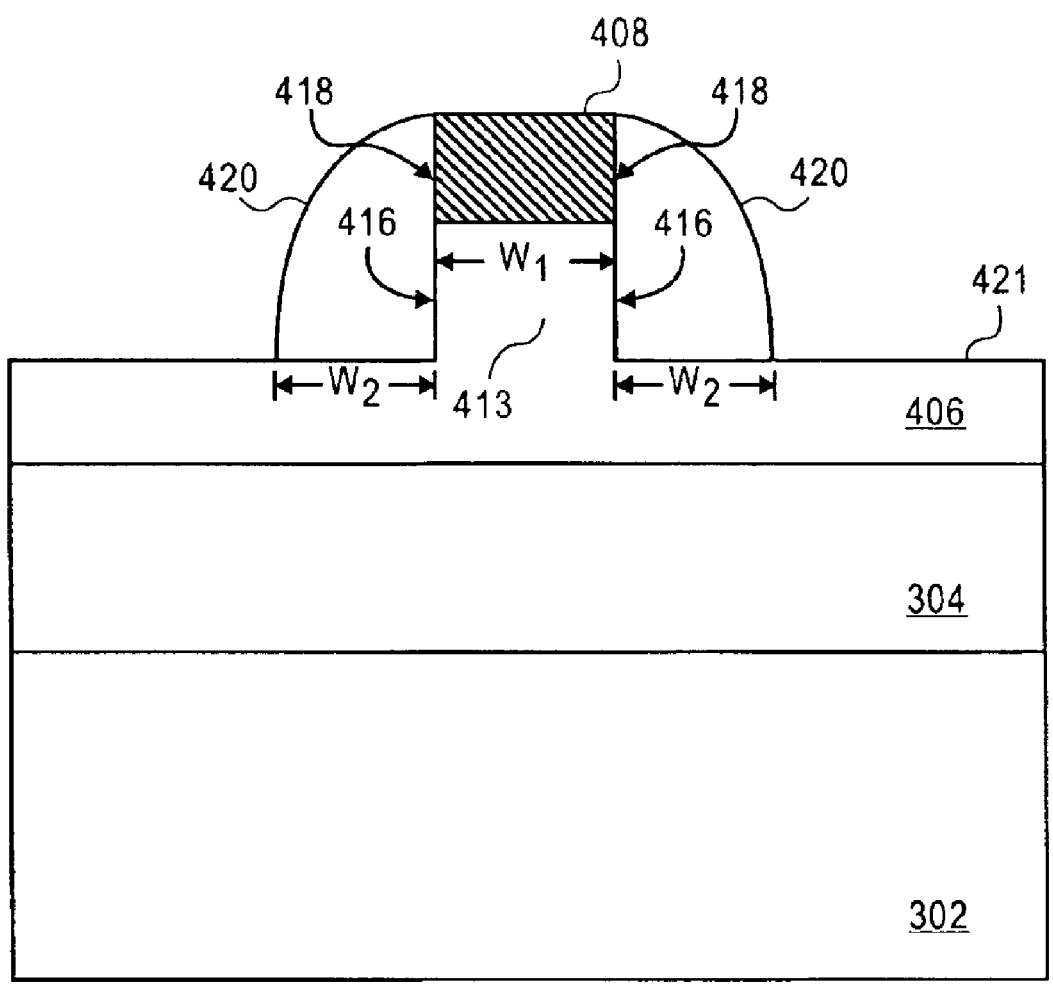

Next, as shown in FIG. 4F, spacers 420 are formed adjacent to, and along the entire sidewall length, of the vertical sidewalls 416 and along the vertical sidewalls 418 of the hardmask 408. The spacers 420 may comprise a material that is different from the material of the semiconductor layer 406, the underlying insulator layer 304, and the hardmask 408. In one embodiment of the invention, the material of the spacers 420 may be a nitride, an oxide, or a combination of a nitride and an oxide, such as a nitride/oxide, or an oxide/nitride/oxide (ONO) composite formed by a rapid thermal oxidation process. Spacers 420 may be formed according to known techniques of depositing a spacer material over the hardmask 408 and over the surface 421 of the unetched portion of the semiconductor layer 406. Know methods include CVD, PVD, and other thin film deposition methods. Once deposited, the spacer material may be vertically etched, such as via an anisotropic etching technique, so that the spacer material is etched primarily in a vertical fashion, but not substantially etched in a horizontal fashion, thus leaving spacers 420 along the vertical sidewalls 416 and 418. The formation of the spacers 420 should include forming the spacers to have a bottom width, w2, hence the thickness of the spacer material should be deposited to a thickness of approximately width w2. The width, w2, is of the lower-most portion of the spacers 420 that touches the surface 421 of the unetched portion of the semiconductor layer 406. The width, w2, should correspond to the width of lower stair steps that will be subsequently formed subjacent to the upper stair step 413. In one embodiment of the invention, the width, w2, is approximately equal to the width, w1, of the upper stair step 413.

Figure 4G:
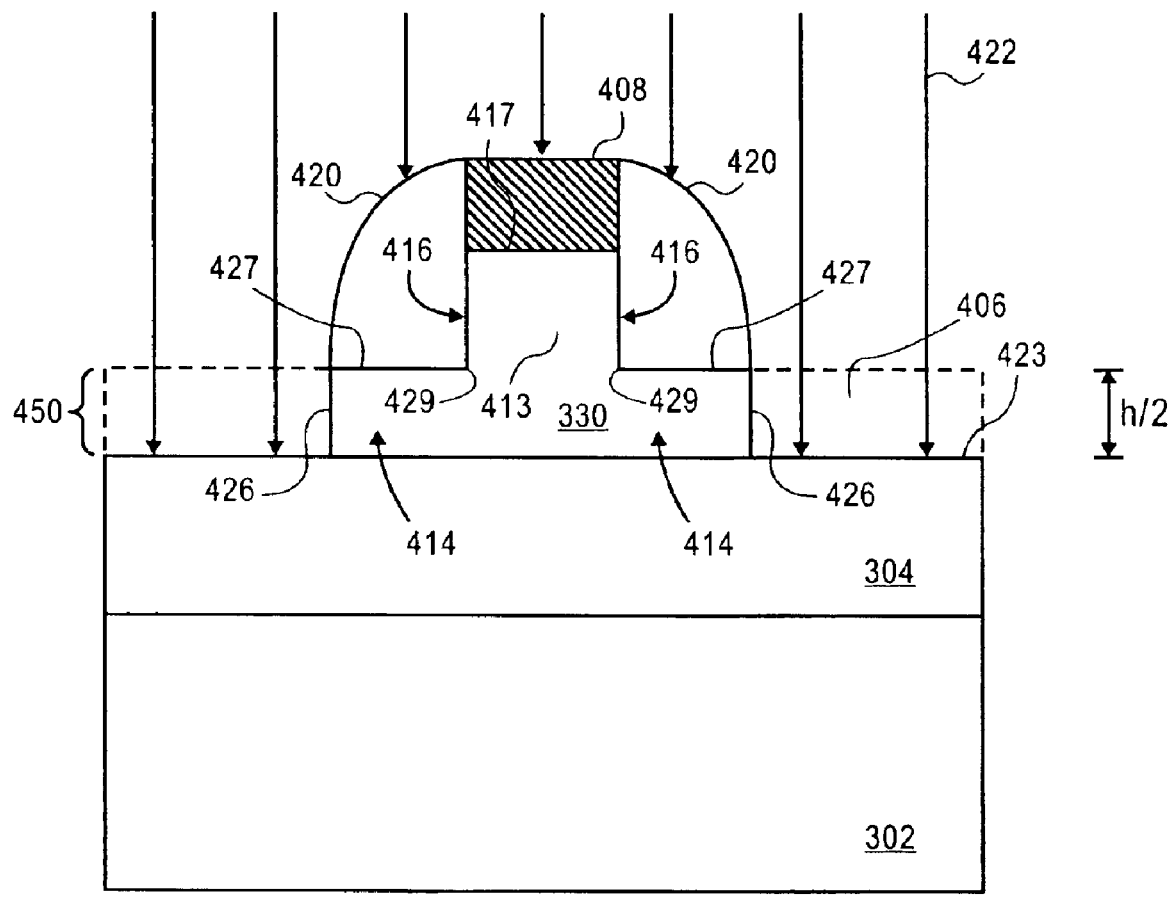

Next, as illustrated in FIG. 4G, the method continues with etching a second portion of the semiconductor layer 406 in alignment with the spacers 420, to a second thickness, to form a second stair-step level 450. The hardmask 408 continues to protect the upper stair step 413 from being etched. As illustrated in FIG. 4G, the remainder of the semiconductor layer 406 is etched with an etchant 422 having a chemistry that etches the semiconductor layer 406 but that does not significantly etch the spacers 420, the hardmask 408 or the underlying insulator layer 304. The etch stops upon the upper surface 423 of the insulator layer 304.

The result is the formation of the second, "lower" stair-step level 450. The lower stair-step level 450 includes two stair steps 414 formed subjacent (adjacent to and below) the plateau-shaped upper stair step 413. The two adjacent stair steps 414 connect to the upper stair step 413 at inverted corners 429. In other words, lower horizontal topwalls 427 of the lower stair steps 414 connect to the vertical sidewalls 416 of the upper stair step 413 at inverted corners 429. The width of the lower horizontal topwalls 427 is the same as the width (w2) of the spacers. The height of the lower vertical sidewalls 426 is equivalent to h/2, or approximately half the original height of the semiconductor layer 406. As shown in FIG. 4G, semiconductor layer 406 is now referred to as semiconductor body 330 having a stair-step shaped structure.

Figure 4H:
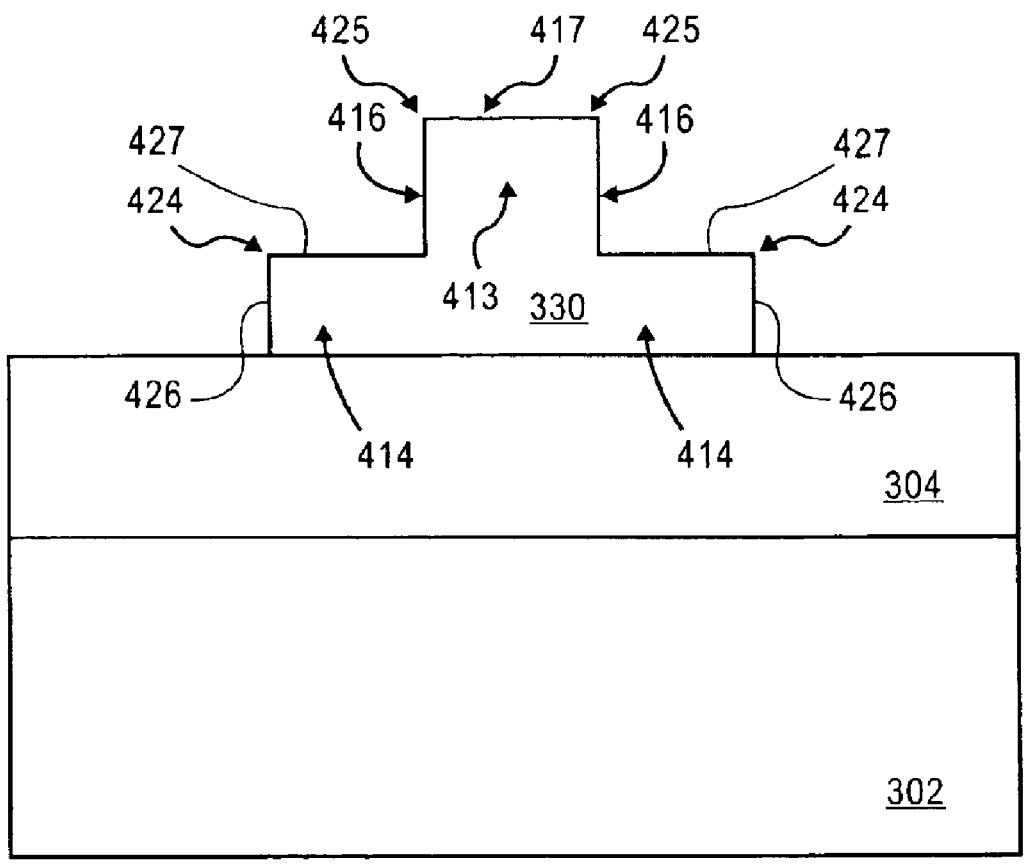
Figure 41:
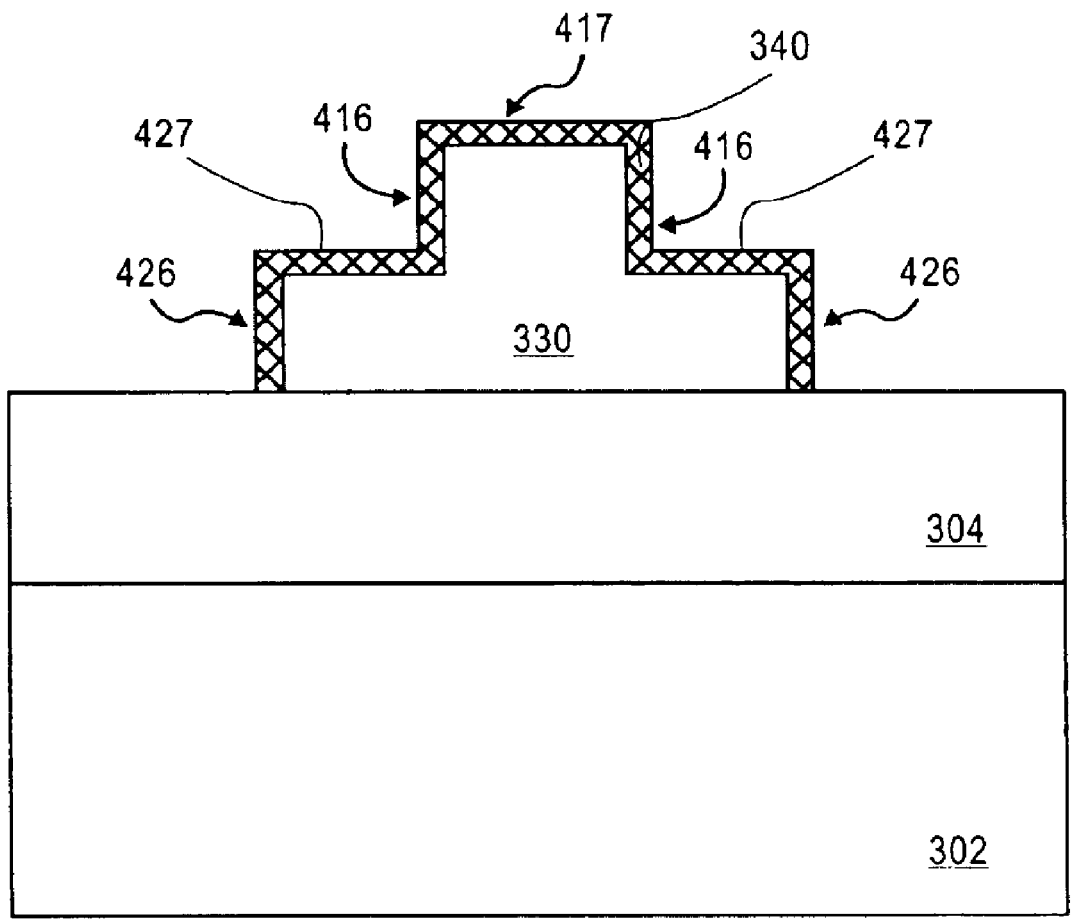

Next, as illustrated in FIG. 4H, the spacers 420 and the hardmask 408 are removed according to known techniques. The chemistries necessary to remove the hardmask 408 and the spacers 420 do not remove the semiconductor body 330 since the semiconductor body 330 comprises a material that is different from both the hardmask 408 and the spacers 420. Still referring to FIG. 4H, the semiconductor body 330 includes two sets of protruding corners 424, 425. Two upper protruding corners 425 are formed where the upper horizontal topwall 417 meets with upper vertical sidewalls 416. Two lower protruding corners 424 are formed where the two lower horizontal topwalls 427 meet with the two lower vertical sidewalls 426. The four corners 424, 425 represent angled edges, or channel conduits, at approximate right angles (90°), that extend between source/drain regions through the semiconductor body 330.

Figure 4J:
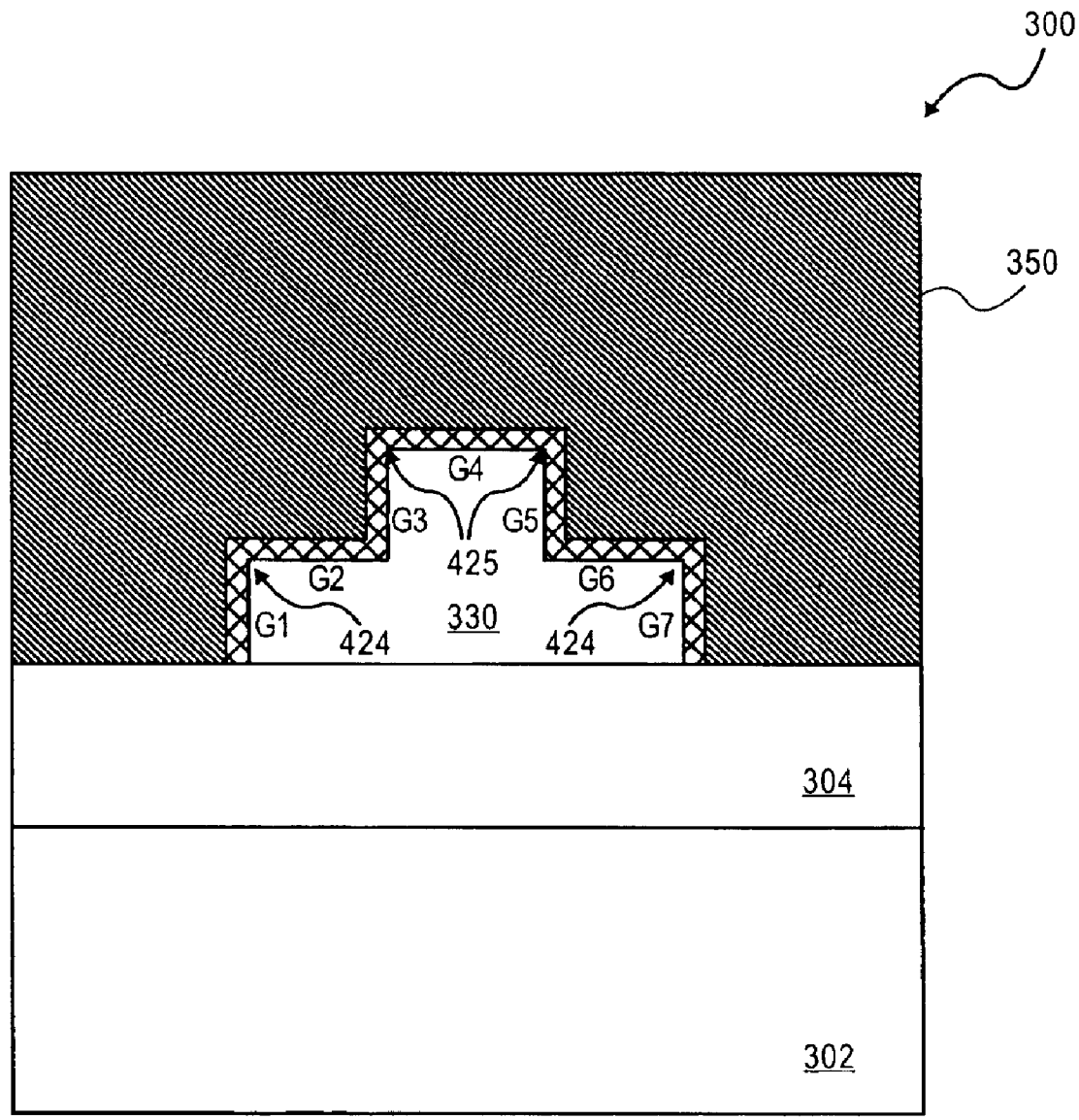

Next, a gate dielectric 340 as illustrated in FIG. 4I and a gate electrode 350 as illustrated in FIG. 4J are formed to border the vertical and horizontal topwalls (426, 427, 416, and 417). Referring first to FIG. 4I, a gate dielectric 340 is formed. In one embodiment of the invention, the gate dielectric 340 may be formed from any insulative material used for insulating the semiconductor body 330 from the gate electrode 350. In one embodiment of the invention, the gate dielectric 340 may be silicon oxide (e.g., $SiO_2$). In other embodiments of the invention, however, the gate dielectric 340 may comprise a material with a dielectric constant (k) substantially higher than the dielectric constant of silicon dioxide (i.e., higher than k=3.9). Exemplary high-k materials used in the formation of integrated devices include metal oxides ($Al_2O_3$, $ZrO_2$, $HfO_2$, $TiO_2$, $Y_2O_3$, $La_2O_3$, etc.), ferroelectrics (PZT, BST, etc.), amorphous metal silicates (Hf, Zr), amorphous silicate oxides ($HfO_2$, $ZrO_2$), and paralectrics ($Ba_xSr_{1-x}TiO_3$, $PbZr_xTi_{1-x}O_3$). The gate dielectric 340 may be formed by a thermal growing process such as oxidation, nitridation or oxynitridation.

Referring next to FIG. 4J, the gate electrode 350 is formed in contact with the gate dielectric 340 and the insulator layer 304. The gate electrode 350 may comprise any conductive material, such as any one of, or a combination of, metal, metal compound, polysilicon, amorphous silicon, or other known conductors or semiconductor materials. In the embodiment of the invention shown in FIG. 4J, the gate electrode 350 comprises polycrystalline silicon ("polysilicon") heavily doped to improve conductivity. The gate electrode 350 may be formed by chemical vapor deposition (CVD), physical vapor deposition (PVD), or other known methods of depositing a thin film. A chemical mechanical polish (CMP) may follow to planarize the top of the gate electrode 350.

The multiple sets of angled edges (424,425) protrude into the gate electrode 350 and extend through the entire length of the channel region within the semiconductor body 330. The abrupt, approximately 90° angle, of the angled edges, 424, 425, allows for a build up of inversion charge within the area close to the angled edges 424 and 425. Each angled edge acts like a conduit for inversion charge, enhancing the flow of electricity through the channel region within the semiconductor body 330. Thus, the many angled edges, 424, 425, may also be referred to herein as "channel conduits", because the function of each angled edge is to act like a conduit for charge within the channel region of the semiconductor body 330.

Still referring to FIG. 4J, several gates (G1–G7) are thus formed. The term "gate" is utilized herein to mean a portion of the gate electrode 350 that is sufficiently close to the semiconductor body 330 to induce an electrically conductive channel. Shown in FIG. 4J, there are 7 such gates, thus allowing seven different surface areas where current can flow from source to drain. As a result, charge is induced between the source/drain regions in 7 channels along the semiconductor body 330 by the voltage applied at gates G1–G7, thus increasing the effective electrical conductivity of the semiconductor body 330, inducing an enhanced flow of electrons through the semiconductor body 330. The flow of electrons, however, becomes highly increased at the angled edges, 424, 425, that protrude into the gate electrode 350. As a result, electrons are permitted to flow through the channel region of the semiconductor body 330 in a very controlled manner and at a higher rate than in a transistor device that does not have the many angled edges. Consequently, the gate length of the transistor 300 can be very small down to around 10 nm, yet the gate electrode 350 has excellent control of the current therein.

Figure 5:
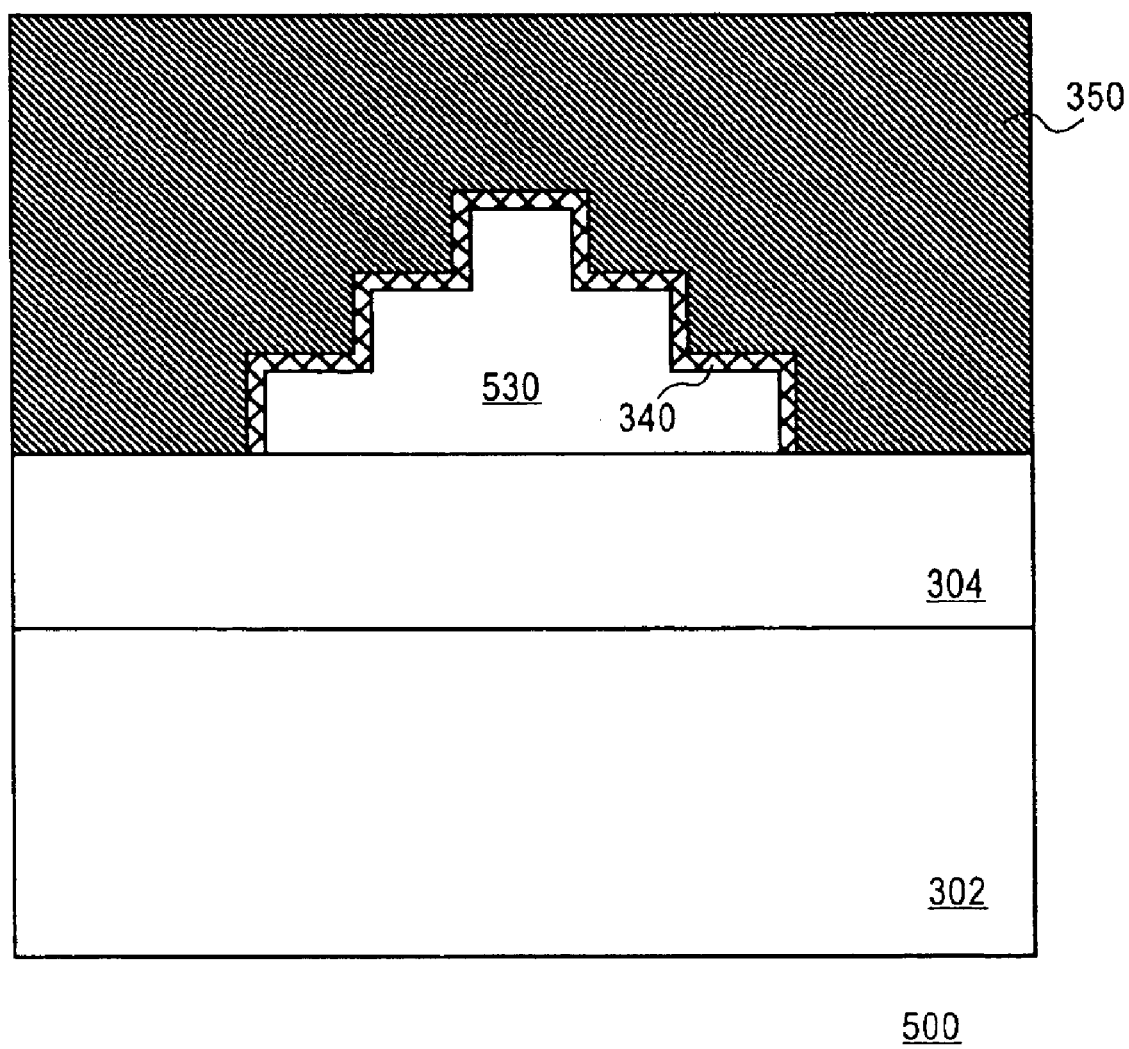
FIG. 5 is an illustration of a transistor 500 having a three-tiered stair-step structure according to another embodiment of the invention.
Figure 6A:
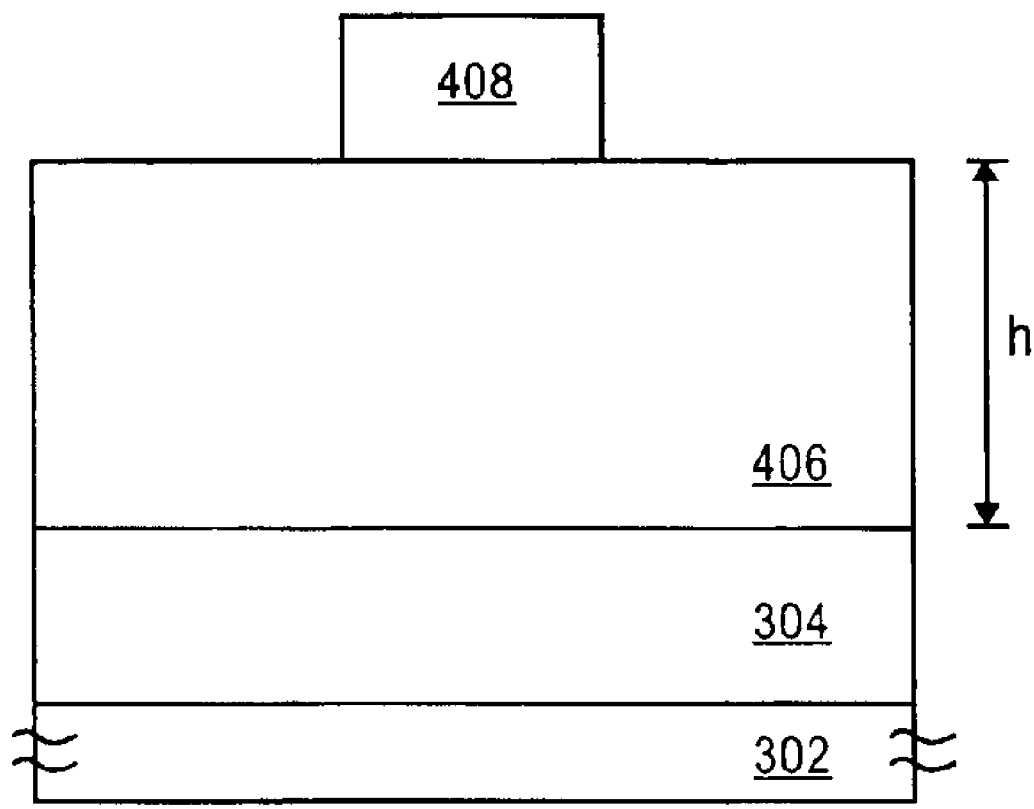
FIG. 6A–6D illustrate a method of forming the transistor 500 according to one embodiment of the invention.
Figure 6B:
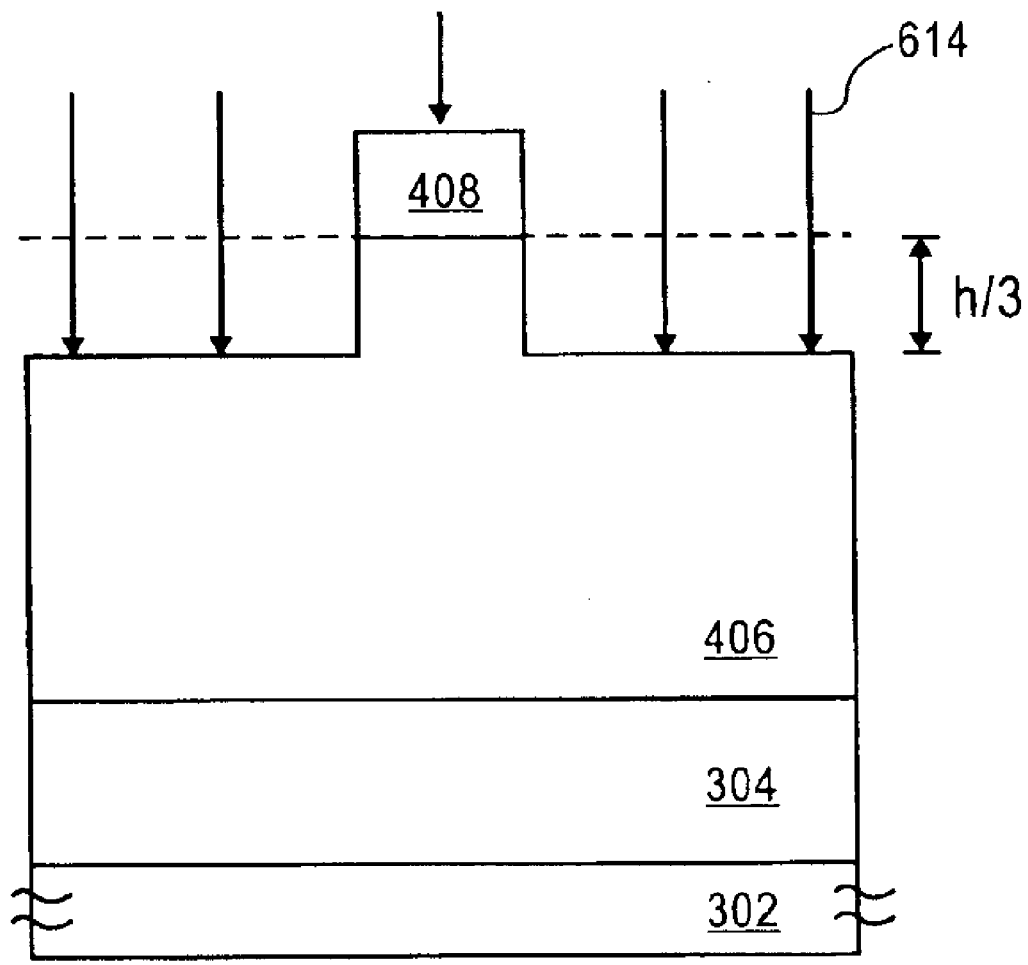
Figure 6C:
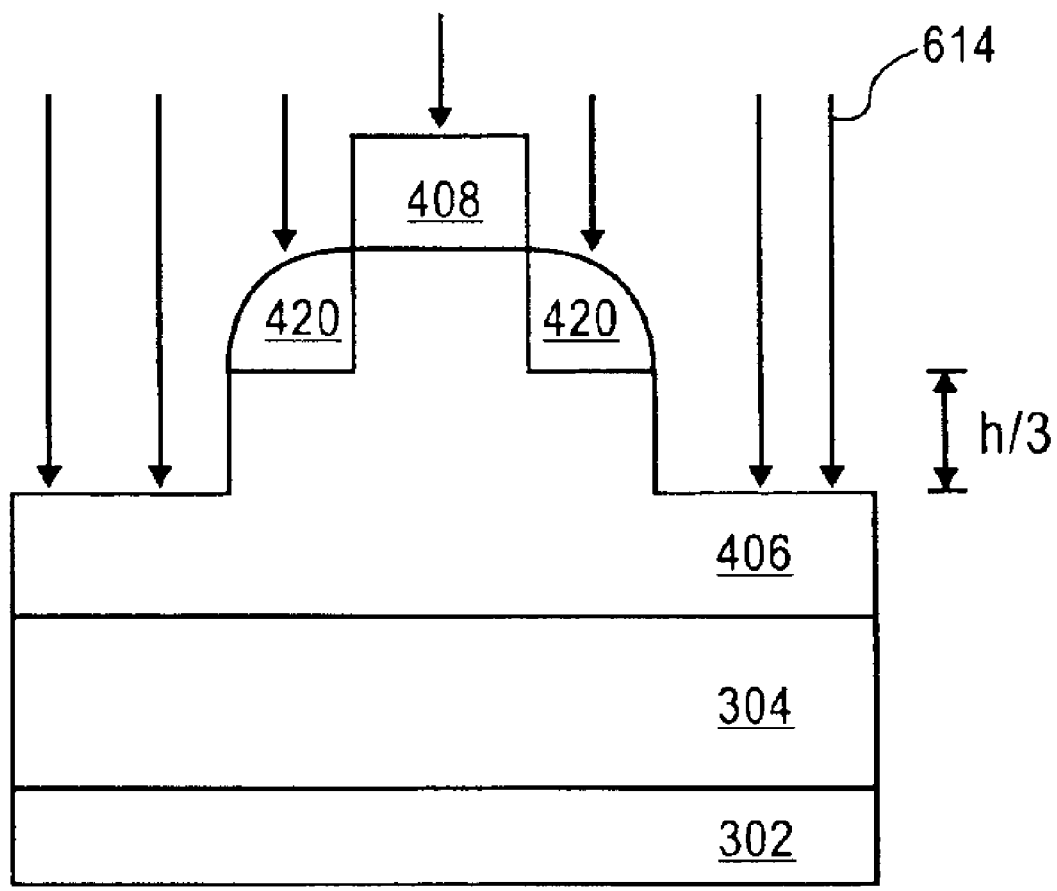
Figure 6D:
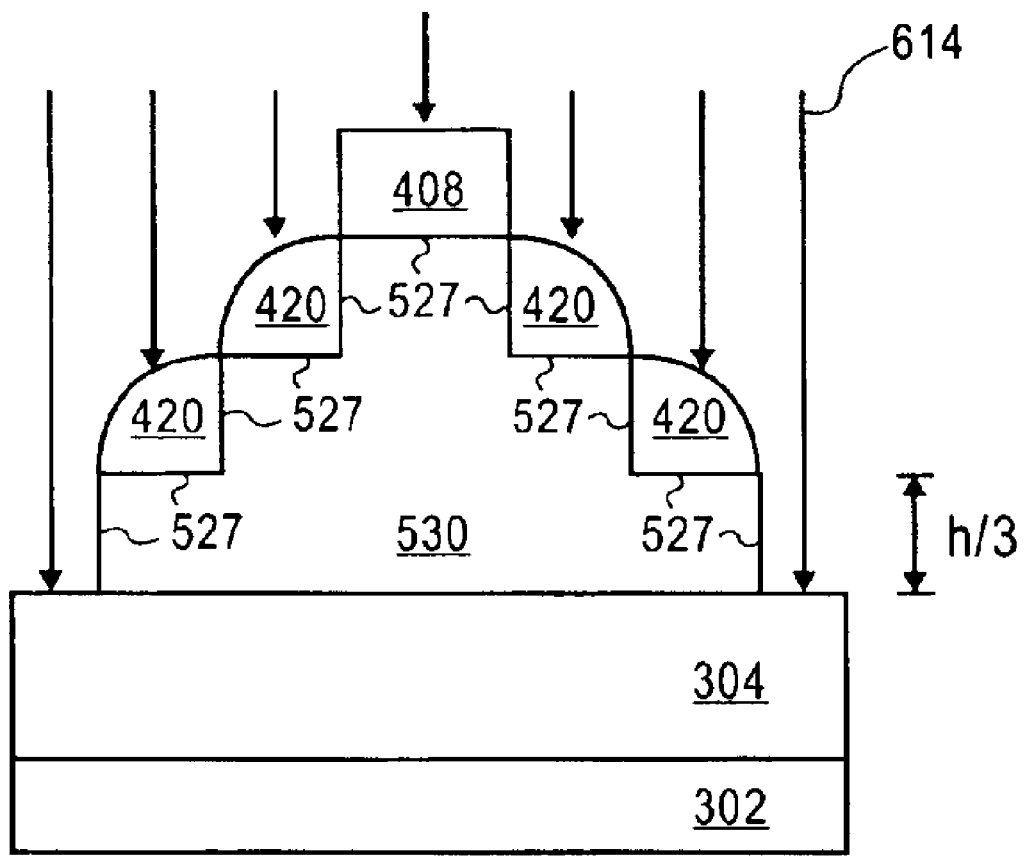

FIG. 5 is an illustration of a transistor 500 having a semiconductor body 530 with a three-tiered stair-step structure, according to another embodiment of the invention. Transistor 500 also has an insulator 304, a substrate 302, a gate dielectric 340, and a gate electrode 350. FIG. 6A–6D illustrate a method of forming the transistor 500 according to one embodiment of the invention. Similar techniques described in conjunction with FIG. 4A–4J may be utilized to form transistor 500, as shown in FIG. 6A–6D. Referring to FIG. 6A, a hardmask 408 is formed upon the stack of semiconductor layer 406, insulator 304, and substrate 302. FIG. 6B–6D show the semiconductor layer 406 being etched with three timed etches (similar to the two timed etches shown in FIG. 4A–4J). FIG. 6B–6D also shows forming two sets of spacers 420 (similar to the formation of the one set of spacers 420 in FIG. 4A–4J.) The three timed etches shown iteratively in FIG. 6B–6D, are timed so that the etchant 614 of each iterative etching procedure only etches the semiconductor layer 406 to a thickness of h/3. The resultant semiconductor body 530 has 11 planar walls and, therefore, may form a transistor having 11 gates.

In comparing the two methods described in FIG. 4A–4J and FIG. 6A–6D, it can be seen that a semiconductor body can be formed to include any number ("n") of gates according to various embodiments of the invention. Hence, more generally, an n-gate structure is described herein. The letter "n" represents a variable number of gates. As described above, in one embodiment of the invention, the transistor can be formed to have seven or more gates. For any number of gates, n, a particular number of stair-step levels ("s") is required. More specifically, for any "n" gates, $s=((n+1)/4)$ stair-step levels are required to be formed. Consequently, during formation, semiconductor layer 406 should be etched, during each iterative timed etch, a vertical distance of h/s, where "h" represents the thickness of the semiconductor layer 406 as originally formed before any timed etches occur, and "s" represents the number of stair-step levels to be formed. The result will be a semiconductor body having a channel region with a particular number of protruding angled edges ("e"), or channel conduits quantified by $e=((n+1)/2)$, or $e=2s$.

Figure 7A:
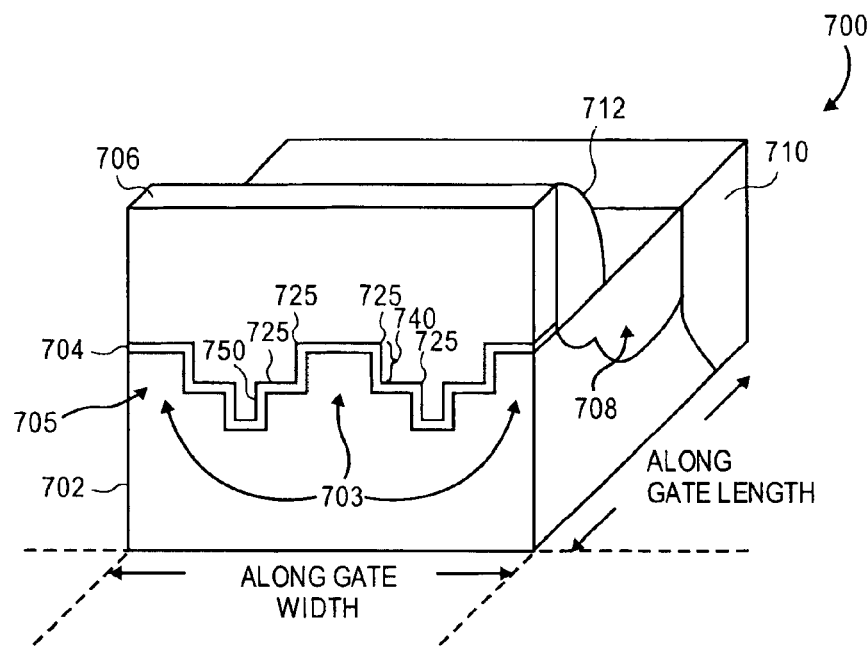
FIG. 7A–7B illustrate is a MOS, or insulated gate, field-effect transistor 700 according to one embodiment of the invention.
Figure 7B:
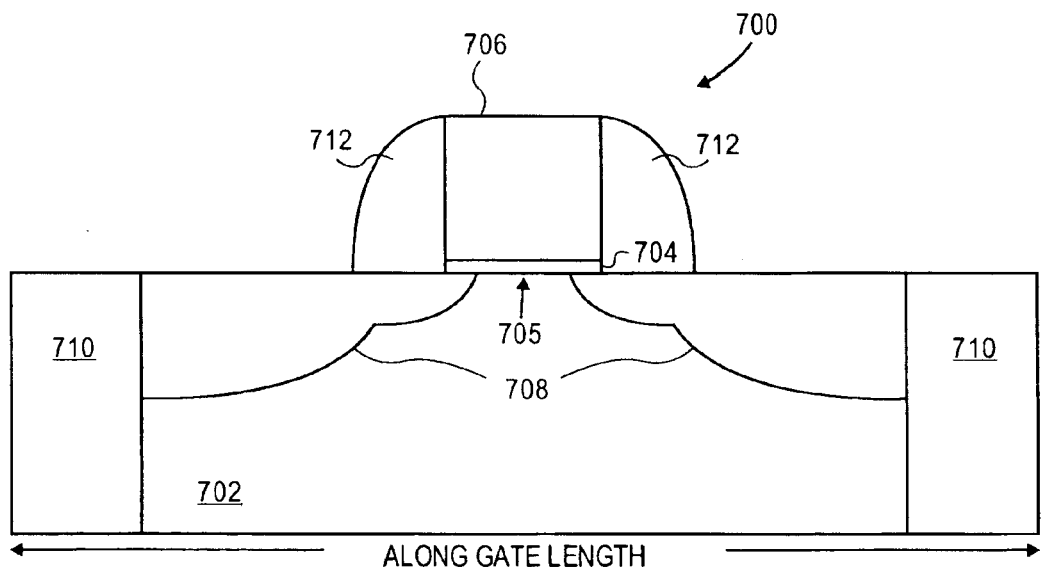

Additionally, embodiments of the invention are not limited to semiconductor-on-insulator (SOI) technology as demonstrated above. Many protruding angled edges can be formed into the channel region of a typical, non-SOI field-effect-transistor (FET), such as a junction FET (JFET) or a metal-oxide-semiconductor FET (MOSFET) (also known as an insulated-gate FET). FIG. 7A–7B illustrates a MOS, or insulated gate, field-effect transistor 700 according to one embodiment of the invention. FIG. 7A is a three-dimensional dissected view of a MOS, or insulated gate, FET 700 showing cross-sectional dissections of the device along both the gate width and the gate length of the transistor 700. FIG. 7B is a cross section of the transistor 700 along the gate length, hence representing a mirror image representation of transistor 700 as shown in FIG. 7A, absent the gate width dissection.

Referring to FIG. 7A–7B, the transistor 700 includes a substrate 702, a gate dielectric 704, a gate electrode 706, and source/drain regions 708. Isolation regions 710 may be formed adjacent to the source/drain regions 708 to isolate the transistor 700 from other electronic devices that may be integrated into the substrate 702. Spacers 712 may also be formed adjacent to the gate electrode 706 according to known processes.

Underlying the gate electrode 706 is a channel region 705. The channel region 705 includes the portion of the substrate 702 directly beneath the gate electrode 706 that connects the source/drain regions 708. The channel region 705 of the transistor 700 includes a stair-step structure 703 formed therein. In the embodiment of the invention illustrated in FIG. 7A, a plurality of stair-step structures 703 have been formed into the channel region 705. The stair-step structures 703 include multiple (more than one) stair-step levels, including an upper stair-step level 740 and a lower stair-step level 750. The stair-step structures 703 further include many angled edges 725 protruding into the gate electrode 706. The many angled edges 725 are to act as electrically conducting conduits wherein inversion charge can build up inside the angled inner contour of the edge when a charge is applied to the gate electrode 706 and through which electrical current can flow between source/drain regions 708.

Figure 8A:
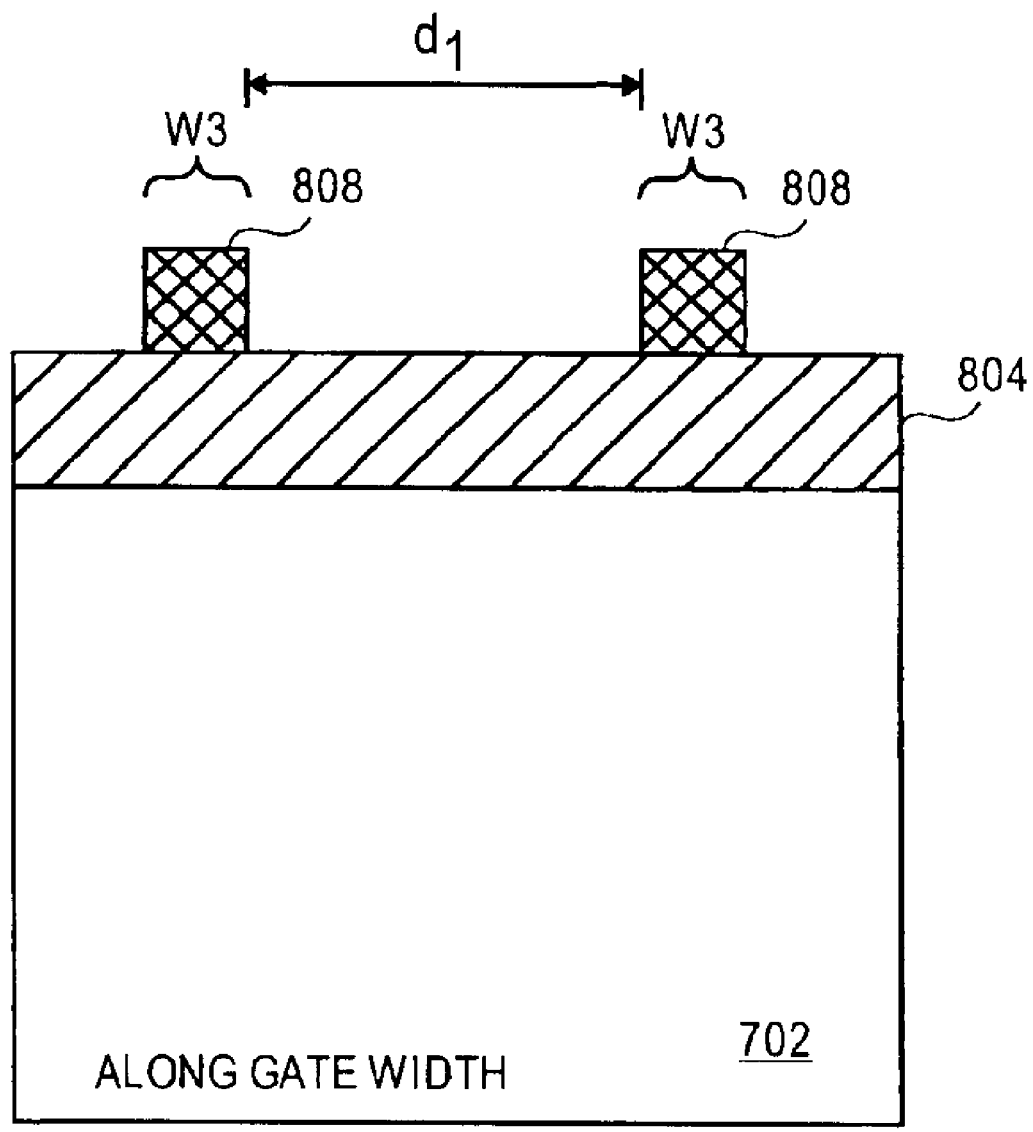
FIG. 8A–8G illustrate a method of forming the transistor 700, according to one embodiment of the invention.

FIG. 8A–8G illustrate a method of forming the transistor 700, according to one embodiment of the invention, along the gate width cross-section. Referring first to FIG. 8A, a protective mask layer ("hardmask layer 804") is formed on a semiconductor substrate 702. The hardmask layer 804 includes a material that is different from the material of the substrate 702 so that the hardmask layer 804 may be etched with a chemistry that is selective to the substrate 702. Upon the hardmask layer 804, a photoresist pattern 808 is formed. The photoresist pattern 808 may be formed according to known techniques. The width (w3) of the photoresist pattern 808 will determine the width of a subsequently formed stair-step, as described in conjunction with FIG. 8C below. The distance (d1) between neighboring photoresist patterns 808 should take into account the width of a total number of stair-step levels to be subsequently formed into the substrate 702. In other words, for a given number of stair step levels ("s") to be formed, the distance, d1, should be at least greater than s times the width w3, or d1>s×(w3). For example, if two stair-step levels will be formed into the substrate 702, then the distance, d1, should be great enough to allow for the formation of two stair steps on either side of the photoresist patterns 808, hence distance, d1, would be greater than two times (2×) the width w3.

Figure 8B:
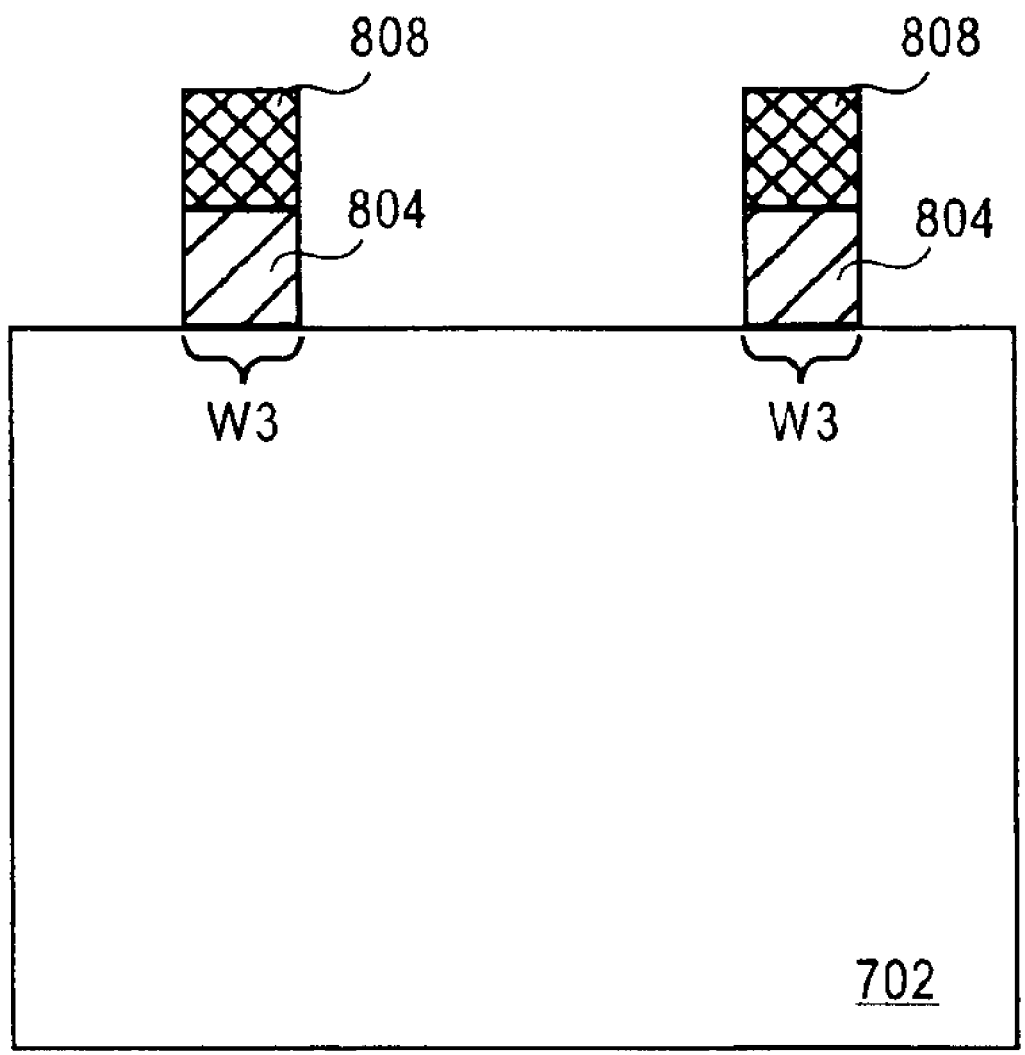

Referring next to FIG. 8B, the dimensions of the photoresist pattern 808 are transferred to the hardmask layer 804 according to known etching techniques. According to one embodiment of the invention, the photoresist pattern 808 is etched with a reactive ion etching technique that utilizes an etch chemistry that etches the hardmask layer 804 but does not etch the photoresist mask 808 nor the underlying substrate 702. The photoresist mask 808 may then be removed, resulting in hardmasks 804 having the width w3.

Figure 8C:
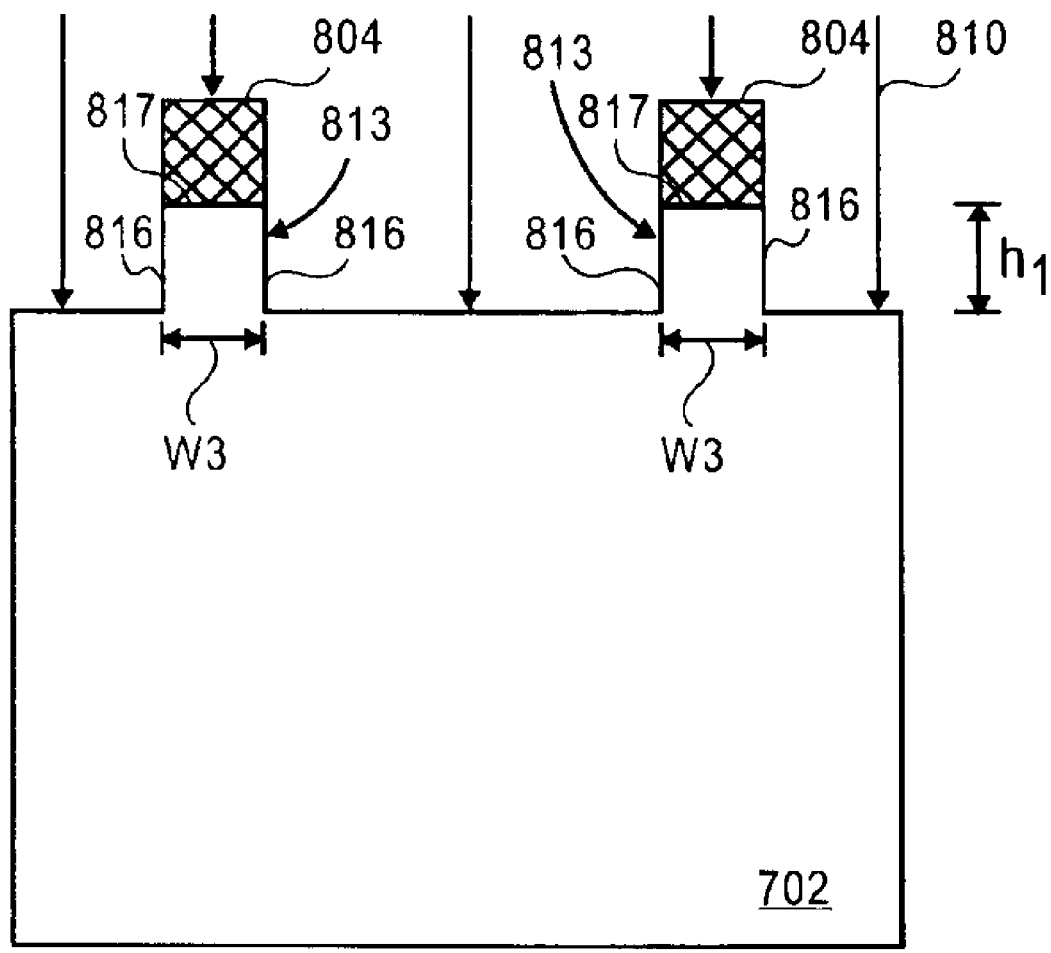

Next, as shown in FIG. 8C, the substrate 702 is etched vertically with an etchant 810 that etches the substrate 702 but does not etch the hardmasks 804 to form a first, "upper" stair step 813. The upper stair step 813 includes two vertical sidewalls 816 and a vertical topwall 817. The etch is carefully timed so that only a certain vertical distance ("h1") is etched. Vertical distance, h1, defines the height of the vertical sidewalls 816. Consequently, upper stair step 813 has a plateau shape with the vertical sidewalls 816 being a given height, h1, and with the horizontal topwall 817 being a given width, (w3).

Figure 8D:
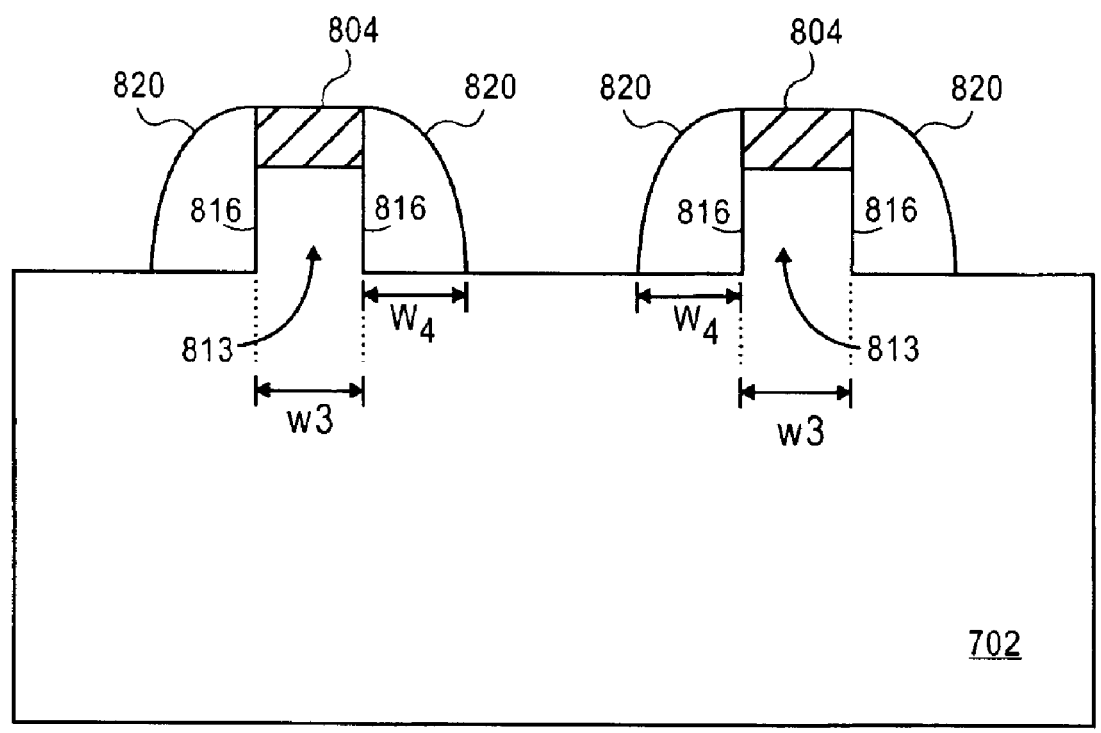

Next, as shown in FIG. 8D, spacers 820 are formed along the entire sidewall length of the upper stair step 813 and along the entire sidewall length of the hardmask 804. The width (w4) of the spacers 820 will define the width of subsequently formed lower stair steps described in conjunction with FIG. 8E below. Consequently, spacers 820 may be formed by depositing a spacer material, different from the material of the hardmask 804 and the substrate 702, that can be etched with a chemistry that will not etch the hardmask 804 nor the substrate 702. The spacer material may be deposited to a thickness of approximately w4, then anisotropically etched so that the resultant spacer 820 has a width of approximately w4. In one embodiment of the invention, the width, w4, is approximately equal to the width, w3, of the upper stair step 813.

Figure 8E:
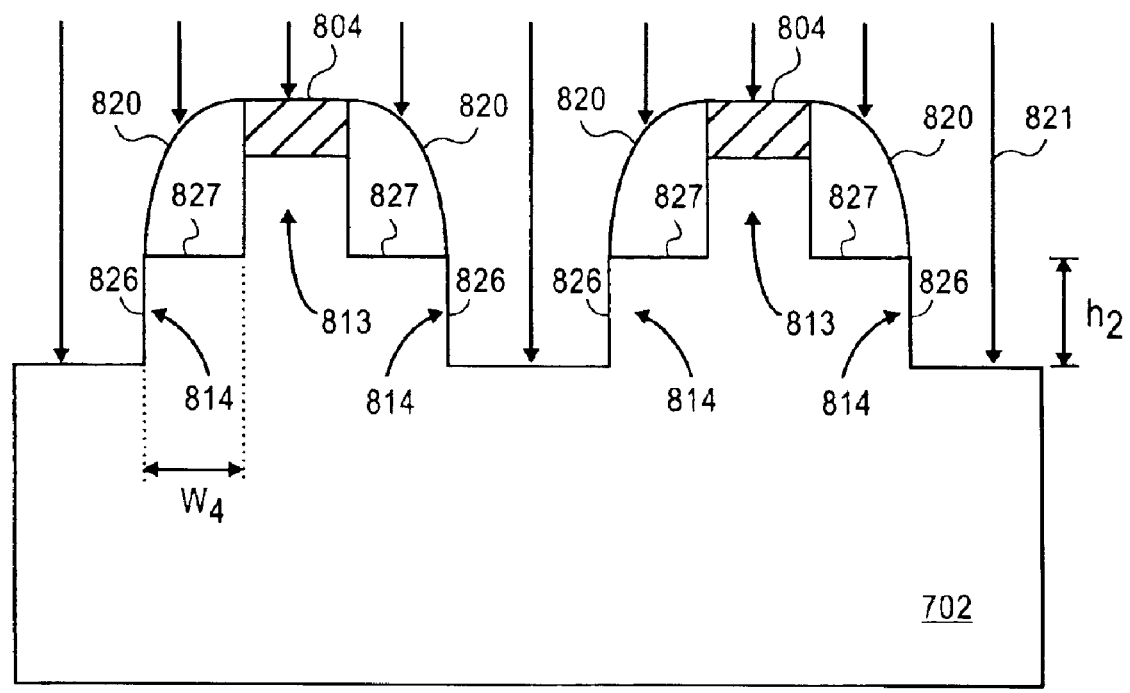

Next, as shown in FIG. 8E, the substrate 702 is again etched vertically with an etchant 821 that etches the substrate 702 but does not etch the hardmasks 804 or the spacers 820, to form a second level of "lower" stair steps 814. The lower stair steps 814 include vertical sidewalls 826 and horizontal topwalls 827. The etch is carefully timed so that only a certain vertical distance ("h2") is etched. Vertical distance, h2, defines the height of the vertical sidewalls 826. Consequently, lower stair steps 814 include sidewalls 826 with a given height, h2, and horizontal topwalls 827 with a given width, w4.

Figure 8F:
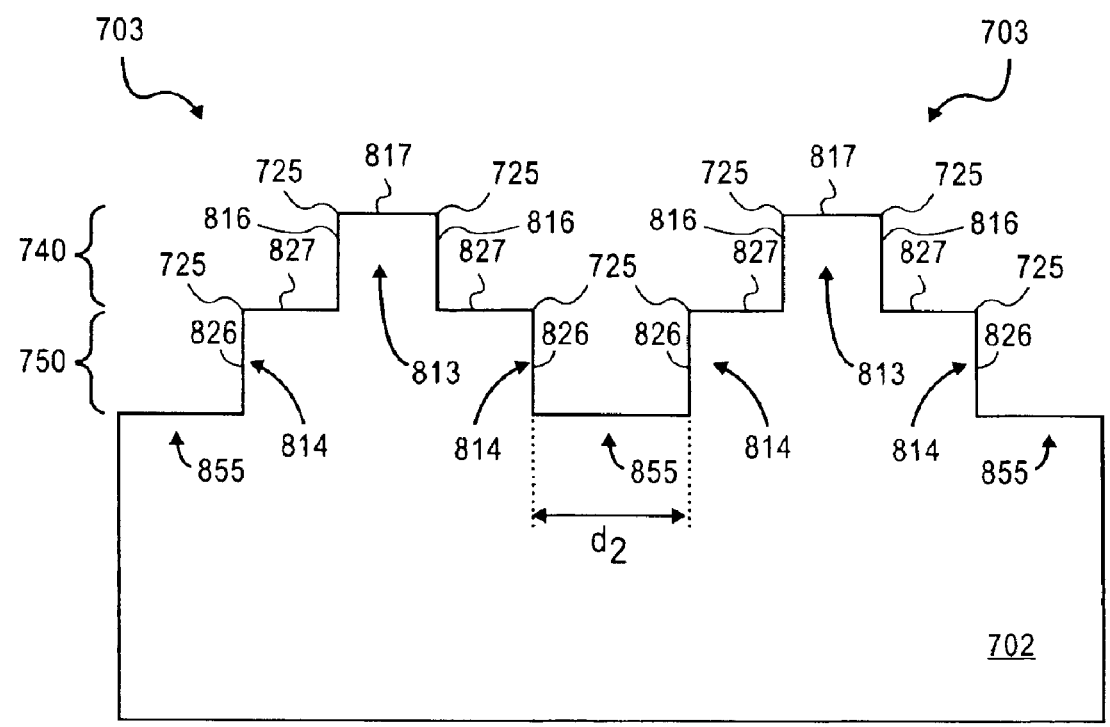

When the spacers 820 and the hardmasks 804 are removed, as shown in FIG. 8F, the result is multiple stair-step structures 703 having multiple stair-step levels 740, 750. A first, upper level 740, includes the upper stair step 813. A second, lower level 750, includes the lower stair steps 814. Stair-step structures 703 still constitute the same material mass as the substrate 702. Angled edges 725 are formed on each level 740 and 750. The angled edges 725 of the upper level 740 are formed at the connection of the upper vertical sidewalls 816 and the upper horizontal topwall 817. The angled edges 725 of the lower level 750 are formed at the connection of the lower vertical sidewalls 826 and the lower horizontal topwalls 827. Adjacent to each stair-step structure 703 are spaces 855 that separate the stair-step structure 703 by a given distance, d2. The spaces 855 must be long enough in length, d2, to establish a corner 826/827, but not so long as to be a significant fraction of the device width.

Figure 8G:
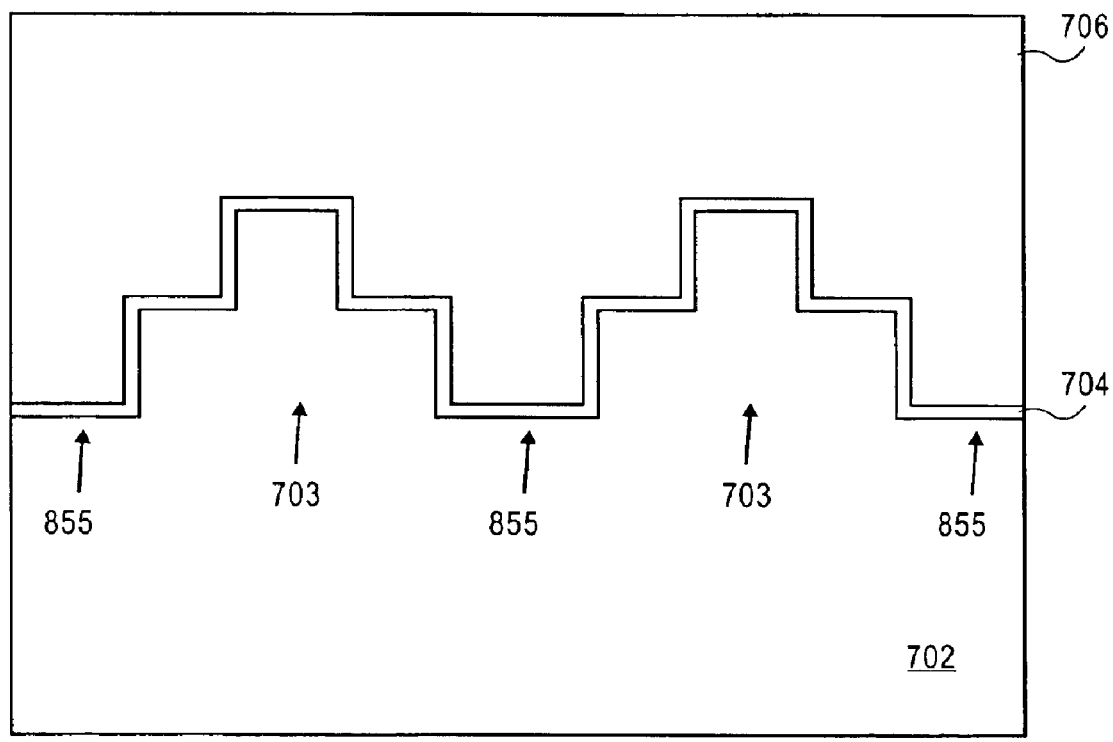

As shown in FIG. 8G, a gate dielectric 704 is formed over the stair-step structures 703 and on the spaces 855 to either sides of the stair-step structures 703. Following the formation of the gate dielectric 704, a gate electrode 706 is formed over the gate dielectric 704. In one embodiment of the invention, the gate dielectric 704 may be formed from any insulative material used for insulating the gate electrode 706 from the substrate 702. In one embodiment of the invention, the gate dielectric 704 may be silicon oxide (e.g., $SiO_2$). In other embodiments of the invention, however, the gate dielectric 704 may comprise a material with a high dielectric constant. Gate dielectric 704 may be formed by a thermal growth process.

After the formation of the gate electrode 706, the gate electrode 706 may be subjected to a CMP process and impurity doping may occur to the surface of the substrate 702 where source/drain regions exist as shown previously in FIG. 7B, where the junctions are formed by conventional implants, by outdiffusion, or by epitaxial growth.

Several embodiments of the invention have thus been described. However, those ordinarily skilled in the art will recognize that the invention is not limited to the embodiments described, but can be practiced with modification and alteration within the spirit and scope of the appended claims that follow.

What is claimed:

1. A method, comprising:

forming a protective mask on a lightly doped monocrystalline semiconductor layer;

etching a first portion of the lightly doped monocrystalline semiconductor layer to a first thickness, in alignment with the protective mask, by a first timed etch, to form a first stair-step level, the first stair-step level including a single upper stair step having two vertical sidewalls and a horizontal topwall;

forming a first set of spacers along the entire length of the two vertical sidewalls of the upper stair step;

etching a second portion of the lightly doped monocrystalline semiconductor layer in alignment with the spacers, to a second thickness, to form a second stair-step level, the second stair-step level having two lower stair steps subjacent to the upper stair step; and forming a gate dielectric and a gate electrode to border the vertical sidewalls and horizontal topwalls of a channel region of the lightly doped monocrystalline semiconductor layer.

2. The method of claim 1, wherein the lightly doped monocrystalline semiconductor layer is formed on an insulator layer that overlies a substrate.

3. The method of claim 2, wherein etching the second portion of the lightly doped monocrystalline semiconductor layer includes etching the semiconductor layer to the insulator layer, thus forming a semiconductor body on the insulator layer, the semiconductor body including at least seven planar walls and at least four protruding angled edges.

4. The method of claim 1, wherein the lightly doped monocrystalline semiconductor layer is a monocrystalline comprises silicon substrate.

5. The method of claim 1, wherein the first and second thicknesses are substantially equal in thickness.

6. The method of claim 1, further comprising:

forming a second set of spacers along vertical sidewalls of the two lower stair steps; and etching a third portion of the lightly doped monocrystalline semiconductor layer in alignment with the second set of spacers, to a third thickness, to form a third stair-step level, the third stair-step level having two additional stair steps subjacent to the two lower stair steps.

* * * * *

UNITED STATES PATENT AND TRADEMARK OFFICE
CERTIFICATE OF CORRECTION

PATENT NO. : 6,960,517 B2
DATED : November 1, 2005
INVENTOR(S) : Rios et al.

It is certified that error appears in the above-identified patent and that said Letters Patent is hereby corrected as shown below:

Column 1,
Line 41, delete "$G_{30}$" and insert -- $G_3$ --.

Column 7,
Lines 25 and 28, delete "41" and insert -- 4I --.

Signed and Sealed this

Seventh Day of February, 2006

JON W. DUDAS
*Director of the United States Patent and Trademark Office*